US012658816B2

(12) United States Patent (10) Patent No.: US 12,658,816 B2
Kawashima (45) Date of Patent: Jun. 16, 2026

(54) POWER CONTROL APPARATUS

(71) Applicant: DENSO CORPORATION, Kariya-city (JP)

(72) Inventor: Takanori Kawashima, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 217 days.

(21) Appl. No.: 18/443,919

(22) Filed: Feb. 16, 2024

(65) Prior Publication Data

US 2024/0186911 A1 Jun. 6, 2024

Related U.S. Application Data

(63) Continuation of application No. PCT/JP2022/033303, filed on Sep. 5, 2022.

(30) Foreign Application Priority Data

Oct. 6, 2021 (JP) ................................. 2021-165000

(51) Int. Cl.
H05K 7/20 (2006.01)
H02M 7/00 (2006.01)
(52) U.S. Cl.
CPC ............ H02M 7/003 (2013.01); H05K 7/209 (2013.01)
(58) Field of Classification Search
CPC ............................... H02M 7/003; H05K 7/209
USPC ........................................................ 361/704
See application file for complete search history.

(56) References Cited

U.S. PATENT DOCUMENTS

| | | | | |
|---|---|---|---|---|
| 7,508,668 | B2 * | 3/2009 | Harada | H01L 23/473 |
| | | | | 361/689 |
| 7,940,526 | B2 * | 5/2011 | Schulz-Harder | H05K 7/20254 |
| | | | | 165/185 |
| 8,111,515 | B2 * | 2/2012 | Akram | H01L 25/0657 |
| | | | | 361/717 |
| 8,125,781 | B2 * | 2/2012 | Mamitsu | H01L 25/115 |
| | | | | 361/689 |
| 8,248,805 | B2 * | 8/2012 | Brandon | H01R 12/7029 |
| | | | | 361/720 |
| 8,363,403 | B2 * | 1/2013 | Tonomoto | H01L 23/4334 |
| | | | | 257/714 |

(Continued)

FOREIGN PATENT DOCUMENTS

| | | |
|---|---|---|
| JP | 2006-295997 A | 10/2006 |
| JP | 2011-120358 A | 6/2011 |

(Continued)

*Primary Examiner* — Anatoly Vortman
(74) *Attorney, Agent, or Firm* — Posz Law Group, PLC

(57) ABSTRACT

A power conversion circuit includes semiconductor modules, a capacitor module, and a cooler. The semiconductor modules each include an upper arm module and a lower arm module arranged in a stack in a stacking direction. Heat exchange members in the cooler are arranged on both ends and between the upper arm modules and the lower arm modules of each of the semiconductor modules in an alternating manner in the stack. The heat exchange members cool the upper arm modules and the lower arm modules. The capacitor module is arranged on one side of the stack in a stacking direction. A power supply bus bar electrically connecting the capacitor module to the semiconductor modules extends in the stacking direction and extends over at least one of the heat exchange members.

9 Claims, 20 Drawing Sheets

(56)  References Cited

U.S. PATENT DOCUMENTS

| | | | | |
|---|---|---|---|---|
| 8,582,291 | B2 * | 11/2013 | Nakasaka | H01L 23/473 |
| | | | | 361/677 |
| 8,634,194 | B2 * | 1/2014 | Yamaura | H05K 7/20927 |
| | | | | 361/709 |
| 8,674,636 | B2 * | 3/2014 | Matsuo | B60L 50/16 |
| | | | | 318/700 |
| 8,724,313 | B2 * | 5/2014 | Nakasaka | H05K 7/20927 |
| | | | | 363/141 |
| 8,792,244 | B2 * | 7/2014 | Funatsu | H05K 7/20927 |
| | | | | 361/677 |
| 8,929,097 | B2 * | 1/2015 | Nakasaka | H05K 7/20927 |
| | | | | 361/810 |
| 9,237,669 | B2 * | 1/2016 | Iwata | B60L 15/007 |
| 9,312,782 | B2 * | 4/2016 | Tachibana | H05K 7/14329 |
| 9,401,671 | B2 * | 7/2016 | Miyachi | H02M 7/003 |
| 10,076,068 | B2 * | 9/2018 | Ohoka | H05K 7/20927 |
| 10,554,145 | B2 * | 2/2020 | Hirasawa | H01G 4/38 |
| 11,303,219 | B2 * | 4/2022 | Kashiwazaki | H02M 7/5387 |
| 11,439,040 | B2 * | 9/2022 | Jo | H05K 7/20 |
| 11,450,647 | B2 * | 9/2022 | Kawashima | H01L 23/367 |
| 12,089,380 | B2 * | 9/2024 | Nishimachi | H01L 23/473 |
| 2001/0033477 | A1 * | 10/2001 | Inoue | H01L 24/33 |
| | | | | 257/E23.098 |
| 2013/0285191 | A1 * | 10/2013 | Inamura | H10D 89/10 |
| | | | | 257/499 |
| 2014/0118909 | A1 | 5/2014 | Matsuno et al. | |
| 2016/0099655 | A1 * | 4/2016 | Inamura | H02M 7/003 |
| | | | | 363/131 |
| 2018/0342959 | A1 * | 11/2018 | Hirasawa | H01G 4/228 |
| 2019/0355649 | A1 | 11/2019 | Kawashima | |
| 2021/0398951 | A1 | 12/2021 | Kakimoto et al. | |

FOREIGN PATENT DOCUMENTS

| | | | |
|---|---|---|---|
| JP | 2014-204589 A | 10/2014 | |
| JP | 2015-139270 A | 7/2015 | |
| JP | 2017-169398 A | 9/2017 | |

* cited by examiner

POWER CONTROL APPARATUS

CROSS REFERENCE TO RELATED APPLICATIONS

The present application is a continuation application of International Patent Application No. PCT/JP2022/033303 filed on Sep. 5, 2022, which designated the U.S. and is based on and claims the benefit of priority from Japanese Patent Application No. 2021-165000 filed on Oct. 6, 2021, and all the contents of the application are incorporated by reference.

TECHNICAL FIELD

The present disclosure relates to a power control apparatus.

BACKGROUND

A power control apparatus includes a plurality of semiconductor modules, a cooler, capacitors, and a plurality of bus bars. An inductance in the power control apparatus may be a key to improve a performance of the power control apparatus. In the above aspects, or in other aspects not mentioned, there is a need for further improvements in the power control apparatus.

SUMMARY

The power control apparatus disclosed herein comprises: a plurality of semiconductor modules each including an upper arm module forming an upper arm of an upper and lower arm circuit and a lower arm module forming a lower arm of the upper and lower arm circuit and being arranged in parallel in a stacking direction to the upper arm module; a cooler having a plurality of heat exchange members arranged alternately with the upper arm module and the lower arm module in each of the semiconductor modules where the heat exchange members together with the upper arm modules and the lower arm modules of the semiconductor modules form a stacked unit such that the heat exchange members cool each of the upper arm modules and the lower arm modules from both sides in the stacking direction; a capacitor disposed on one end side of the stacked unit in the stacking direction; and a plurality of bus bars electrically connecting the capacitor and each of the semiconductor modules and including a power bus bar extending in the stacking direction so as to cross over at least one of the heat exchange members.

According to the disclosed power control apparatus, the plurality of semiconductor modules are grouped into upper arm modules and lower arm modules, and the upper arm modules and the lower arm modules are arranged in parallel in the stacking direction. According to this, it is possible to shorten a PN current loop. Further, the capacitor is arranged in the stacking direction with respect to the stacked unit, and the power bus bars are formed to be extended in the stacking direction so as to straddle at least one of the heat exchange members. According to this, it is possible to shorten a length of the power bus bars, i.e., a current path. As a result, it is possible to provide the power control apparatus capable of reducing an inductance.

Disclosed embodiments herein employ different technical means to achieve their respective objectives. The objectives, features, and effects disclosed herein are further clarified by reference to the subsequent detailed description and accompanying drawings.

BRIEF DESCRIPTION OF DRAWINGS

The disclosure is further described with reference to the accompanying drawings in which:

FIG. 7 is a plan view showing an arrangement of semiconductor elements, front metal members of substrates, and main terminals;

FIG. 10 is a cross sectional view along a line X-X in FIG. 9;

FIG. 11 is a plan view showing an arrangement of a stacked unit and bus bars;

DETAILED DESCRIPTION

Figure 1:
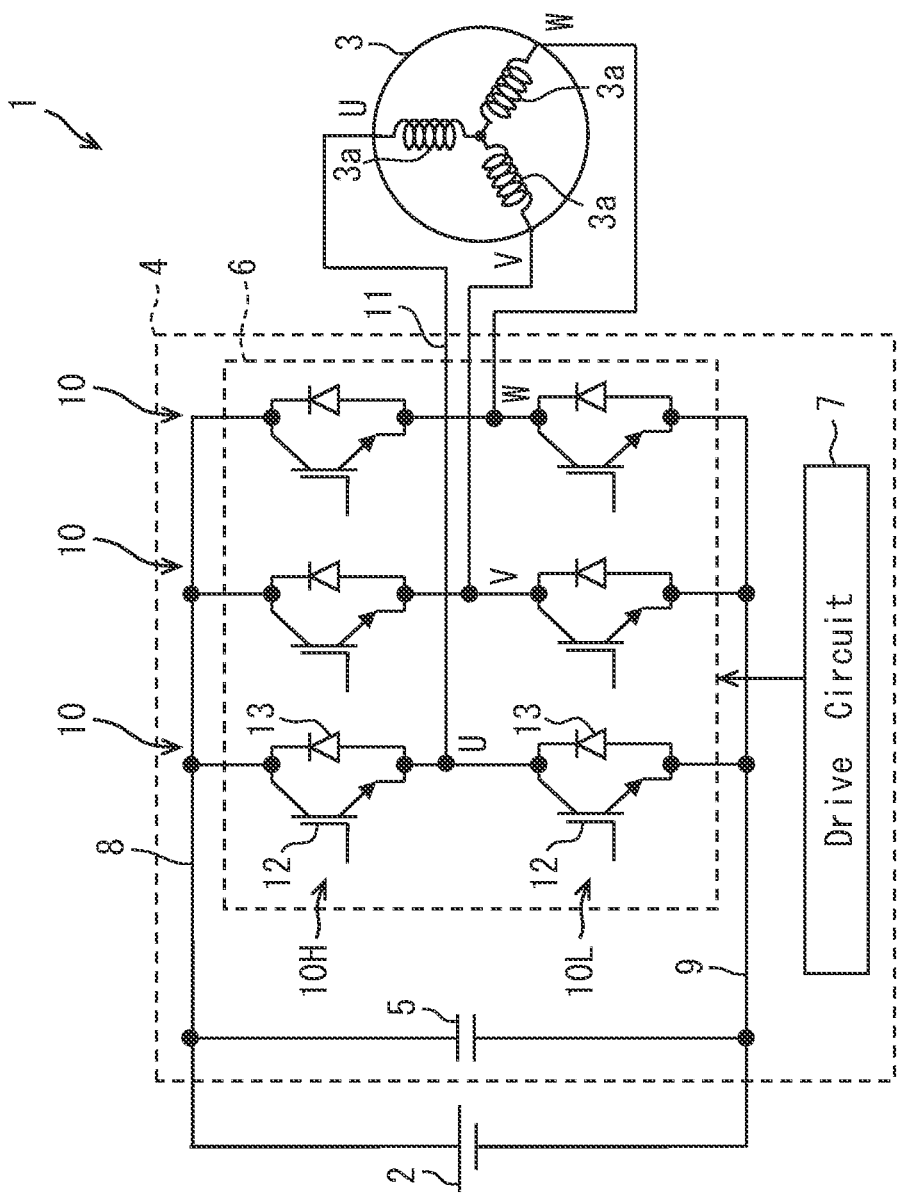
FIG. 1 is a diagram showing a circuit configuration and a drive system of a power control apparatus according to a first embodiment.

JP2006-295997A discloses a power control apparatus. This power control apparatus includes a plurality of semiconductor modules, a cooler, capacitors, and a plurality of bus bars. The cooler has a plurality of heat exchange portions arranged in multiple stages so as to sandwich each of the semiconductor modules from both sides. The plurality of bus bars include power bus bars that electrically connect the capacitors and the semiconductor modules. The disclosure of Patent Literature is incorporated herein by reference to explain technical elements described herein.

In JP2006-295997A, each semiconductor module constitutes an upper and lower arm circuit for one phase. Such a semiconductor module has a semiconductor element constituting an upper arm and a semiconductor element constituting a lower arm within an inside, and these semiconductor elements are arranged in parallel in one direction perpendicular to the stacking direction. Therefore, a PN current loop becomes large within the semiconductor module. Further, the capacitor is arranged on a side in one direction perpendicular to the stacking direction with respect to the stacked unit of the semiconductor module and a heat exchange member. Pipes, which introducing and discharging a cooling fluid into and from the heat exchange member, are arranged between the semiconductor module and the capacitor. Therefore, the power bus bars must be laid across the pipe of the cooler, and the power bus bars becomes long. From the viewpoint described above or from other unmentioned viewpoints, there is a demand for further improvement to the power control apparatus. It is an object of the disclosure to provide a power control apparatus with a reduced inductance.

Hereinafter, a plurality of embodiments are described with reference to the drawings. The same or corresponding elements in the embodiments are assigned the same reference numerals, and descriptions thereof are not be repeated. When only a part of the configuration is described in one embodiment, the other parts of the configuration may employ descriptions about a corresponding configuration in another embodiment preceding the one embodiment. Further, not only the combinations of the configurations explicitly shown in the description of the respective embodiments, but also the configurations of multiple embodiments can be partially combined even when they are not explicitly shown as long as there is no difficulty in the combination in particular.

The power control apparatus according to the present embodiment is applicable to, e.g., a power conversion device for a moving object with a rotary electric machine as a drive source. The moving object is, e.g., an electrically driven vehicle such as an electric vehicle (BEV), a hybrid vehicle (HEV), or a plug-in hybrid vehicle (PHEV), a flying object such as a drone, a ship, a construction machine, or an agricultural machine. Hereinafter, an example applied to a vehicle is described.

First Embodiment

First, a schematic configuration of a vehicle drive system is described with reference to FIG. 1.
<Vehicle Drive System>
As shown in FIG. 1, a vehicle drive system 1 is provided with a DC power supply 2, a motor generator 3, and a power control apparatus 4.

The DC power supply 2 is a direct-current voltage source including a chargeable/dischargeable secondary battery. The secondary battery is, e.g., a lithium ion battery or a nickel hydride battery. The motor generator 3 is a three-phase AC type rotary electric machine. The motor generator 3 functions as a vehicle driving power source, i.e., an electric motor. The motor generator 3 functions also as a generator during regeneration. The power control apparatus 4 performs electric power conversion between the DC power supply 2 and the motor generator 3.
<Circuit Configuration of Power Control Apparatus>
FIG. 1 shows a circuit configuration of the power control apparatus 4. The power control apparatus 4 includes a power conversion circuit. The power control apparatus 4 of this embodiment includes a smoothing capacitor 5, an inverter 6 which is a power conversion circuit, and a drive circuit 7.

The smoothing capacitor 5 mainly smooths the DC voltage supplied from the DC power supply 2. The smoothing capacitor 5 is connected between a P-line 8 which is a power line on a high potential side and an N-line 9 which is a power line on a low potential side. The P-line 8 is connected to a positive electrode of the DC power supply 2, and the N-line 9 is connected to a negative electrode of the DC power supply 2. The positive electrode of the smoothing capacitor 5 is connected to the P-line 8 at a position between the DC power supply 2 and the inverter 6. The negative electrode of the smoothing capacitor 5 is connected to the N-line 9 at a position between the DC power supply 2 and the inverter 6. The smoothing capacitor 5 is connected to the DC power supply 2 in parallel.

The inverter 6 is a DC-AC conversion circuit. The inverter 6 converts the DC voltage into a three-phase AC voltage according to the switching control by the control circuit (not shown) and outputs the three-phase AC voltage to the motor generator 3. Thereby, the motor generator 3 is driven to generate a predetermined torque. At the time of regenerative braking of the vehicle, the inverter 6 converts the three-phase AC voltage generated by the motor generator 3 by receiving the rotational force from the wheels into a DC voltage according to the switching control by the control circuit 13, and outputs the DC voltage to the P-line 8. In this way, the inverter 6 performs bidirectional power conversion between the DC power supply 2 and the motor generator 3.

The inverter 6 includes upper and lower arm circuits 10 for three phases. The upper and lower arm circuits 10 may be referred to as legs. Each of the upper and lower arm circuits 10 has an upper arm 10H and a lower arm 10L. Hereinafter, the upper arm 10H and the lower arm 10L may be simply referred to as an arms 10H and 10L. The upper arm 10H and the lower arm 10L are connected in series between the P-line 8 and the N-line 9 with the upper arm 10H is connected to the P-line 8. A connection point between the upper arm 10H and the lower arm 10L is connected to a winding 3a of a corresponding phase in the motor generator 3 via an output line 11. The inverter 6 has six arms 10H and 10L. Each arm 10H and 10L is configured to include a switching element.

In this embodiment, an n-channel type insulated gate bipolar transistor 12 (hereinafter referred to as an IGBT 12) is adopted as a switching element constituting each arm 10H and 10L. The IGBT is an abbreviation of an insulated gate bipolar transistor. A free wheel diode 13 (hereinafter referred to as FWD 13) is connected in a parallel and reversed manner to each of the IGBTs 12.

In the upper arm 10H, the collector of the IGBT 12 is connected to the P-line 8. In the lower arm 10L, the emitter of the IGBT 12 is connected to the N-Line 9. The emitter of the IGBT 12 in the upper arm 10H and the collector of the IGBT 12 in the lower arm 10L are connected each other. An anode of the FWD 13 is connected to the emitter of the corresponding IGBT 12, and a cathode of the FWD 13 is connected to the collector of the corresponding IGBT 12.

The switching element is not limited to the IGBT 12. For example, a MOSFET may be used. MOSFET is an abbreviation for Metal Oxide Semiconductor Field Effect Transistor. In the case of a MOSFET, the freewheeling diode may be provided by a parasitic diode (body diode) or an external diode.

The drive circuit 7 drives switching elements that constitute the power conversion circuit such as the inverter 6. The drive circuit 7 supplies a drive voltage to the gate of the IGBT 12 of the corresponding arm 10H and 10L based on the drive command of the control circuit. The drive circuit drives, i.e., turns on and turns off, the corresponding IGBT 12 by applying a drive voltage. The drive circuit may be referred to as a driver.

The power control apparatus 4 may include a control circuit for the switching element. The control circuit generates a drive command for operating the IGBT 12 and outputs the drive command to the drive circuit 7. The control circuit generates a drive command based on a torque request input from a host ECU (not illustrated) and signals detected by various sensors. ECU is an abbreviation of Electronic Control Unit. The control circuit may be provided within the host ECU.

The various sensors may include a current sensor, a rotation angle sensor, and a voltage sensor. The power control apparatus 4 may include at least one sensor. The current sensor detects a phase current flowing through the winding 3a of each phase. The rotation angle sensor detects a rotation angle of a rotor of the motor generator 3. The voltage sensor detects the voltage across the smoothing capacitor 5. The control circuit includes, e.g., a processor and a memory. The control circuit outputs, e.g., a PWM signal as the drive command. PWM is an abbreviation for Pulse Width Modulation.

The power control apparatus 4 may further include a converter as the power conversion circuit. The converter is a DC-DC converter circuit for converting the DC voltage to a DC voltage with different value. The converter is provided between the DC power supply 2 and the smoothing capacitor 5. The converter is configured to include, e.g., a reactor and the above-mentioned upper and lower arm circuit 10. This configuration can boost and/or suppress voltage. The power control apparatus 4 may further include a filter capacitor for removing power supply noise from the DC power supply 2. The filter capacitor is provided between the DC power supply 2 and the converter.

<Configuration of Power Control Apparatus>

Figure 2:
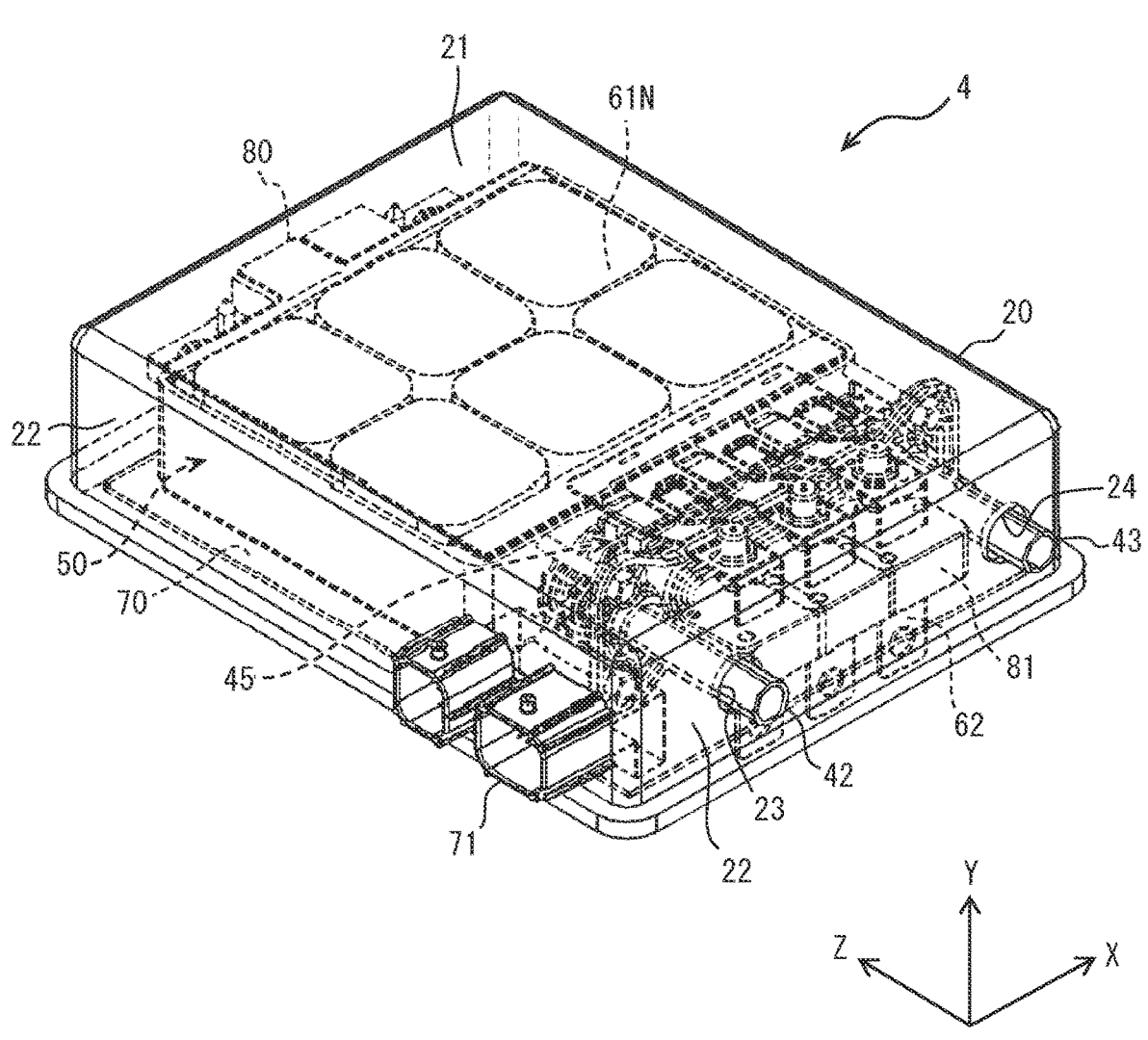
FIG. 2 is a perspective view showing a power control apparatus.
Figure 3:
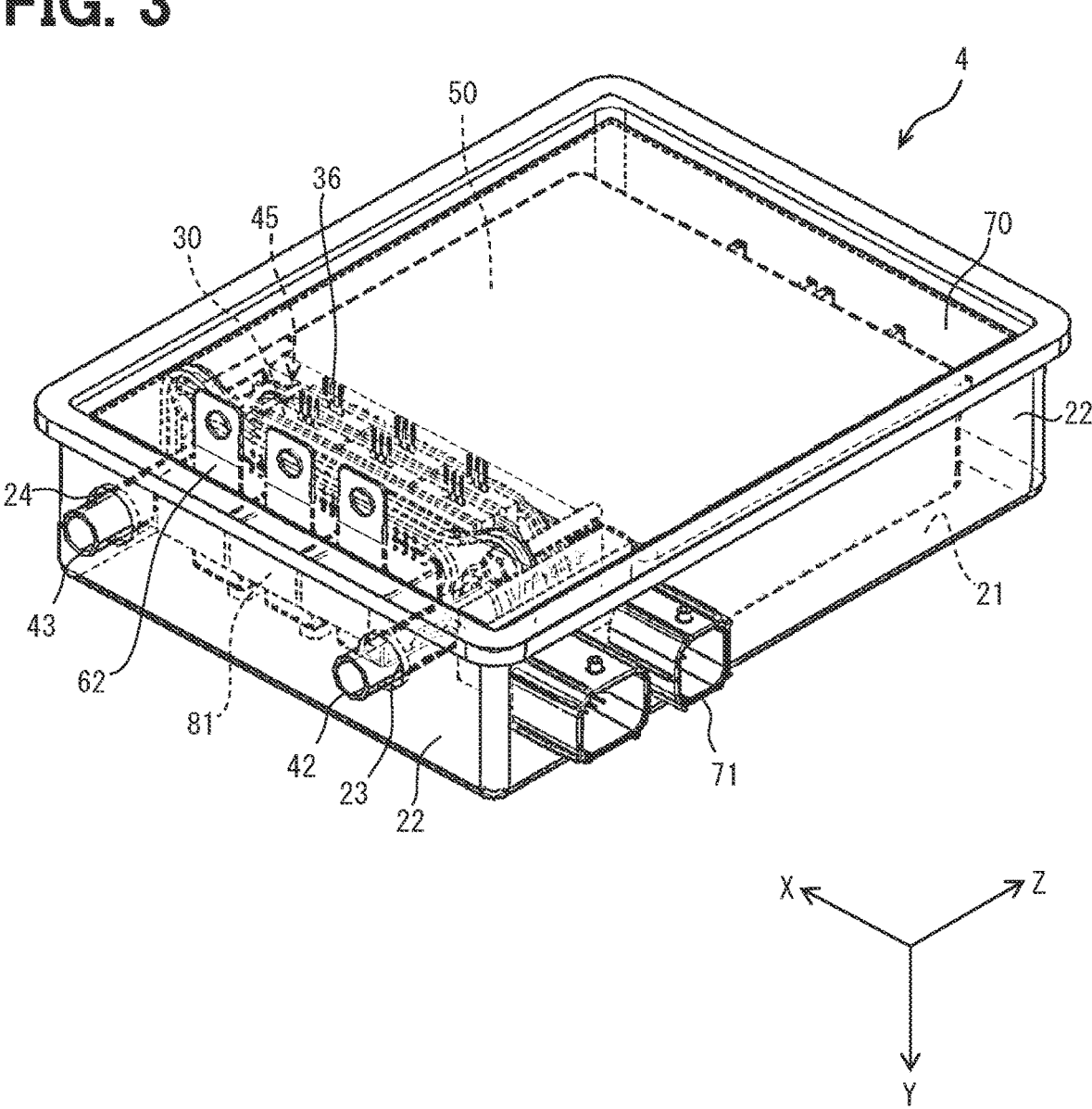
FIG. 3 is a perspective view from an opposite side.
Figure 4:
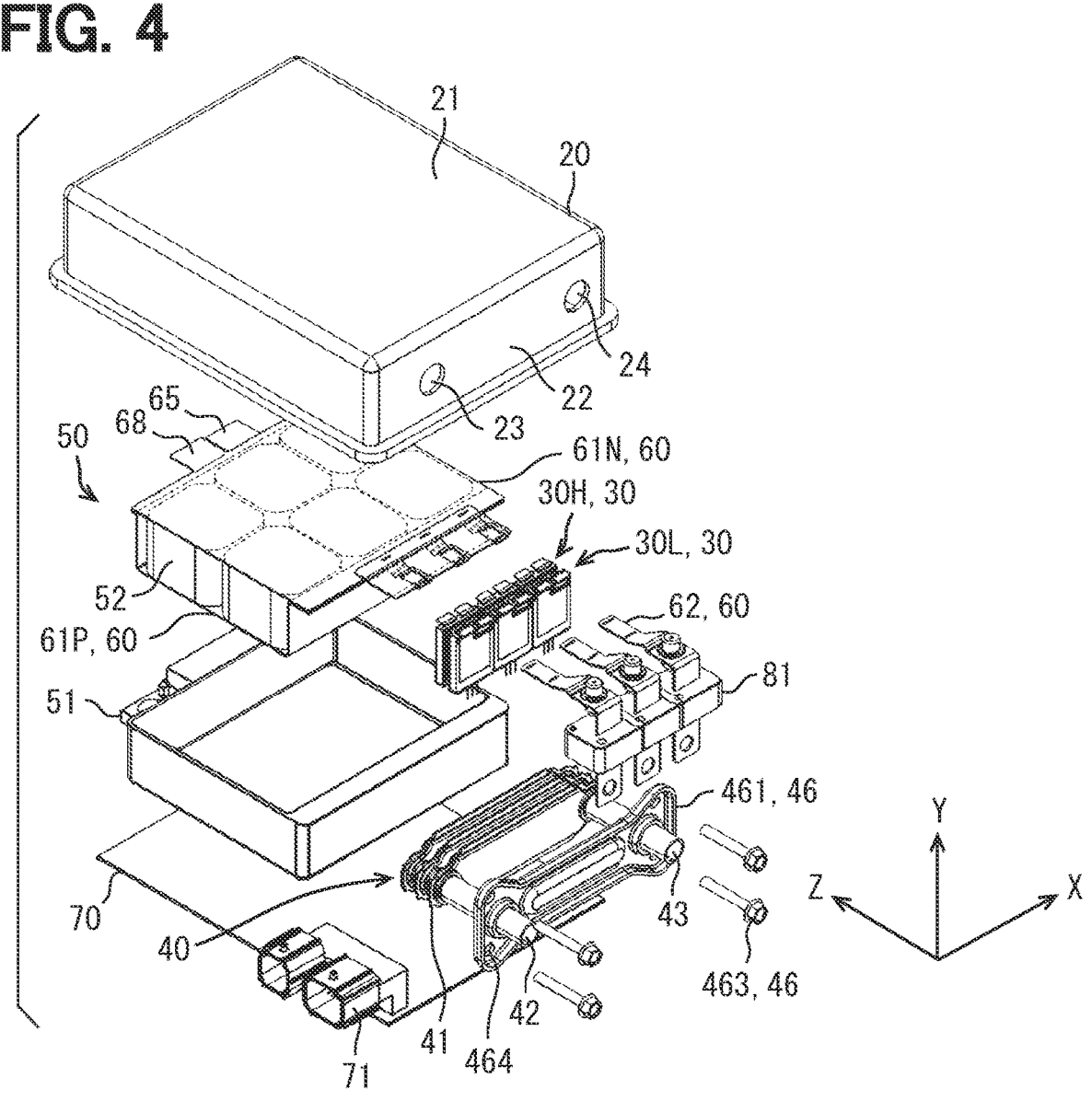
FIG. 4 is an exploded perspective view.
Figure 5:
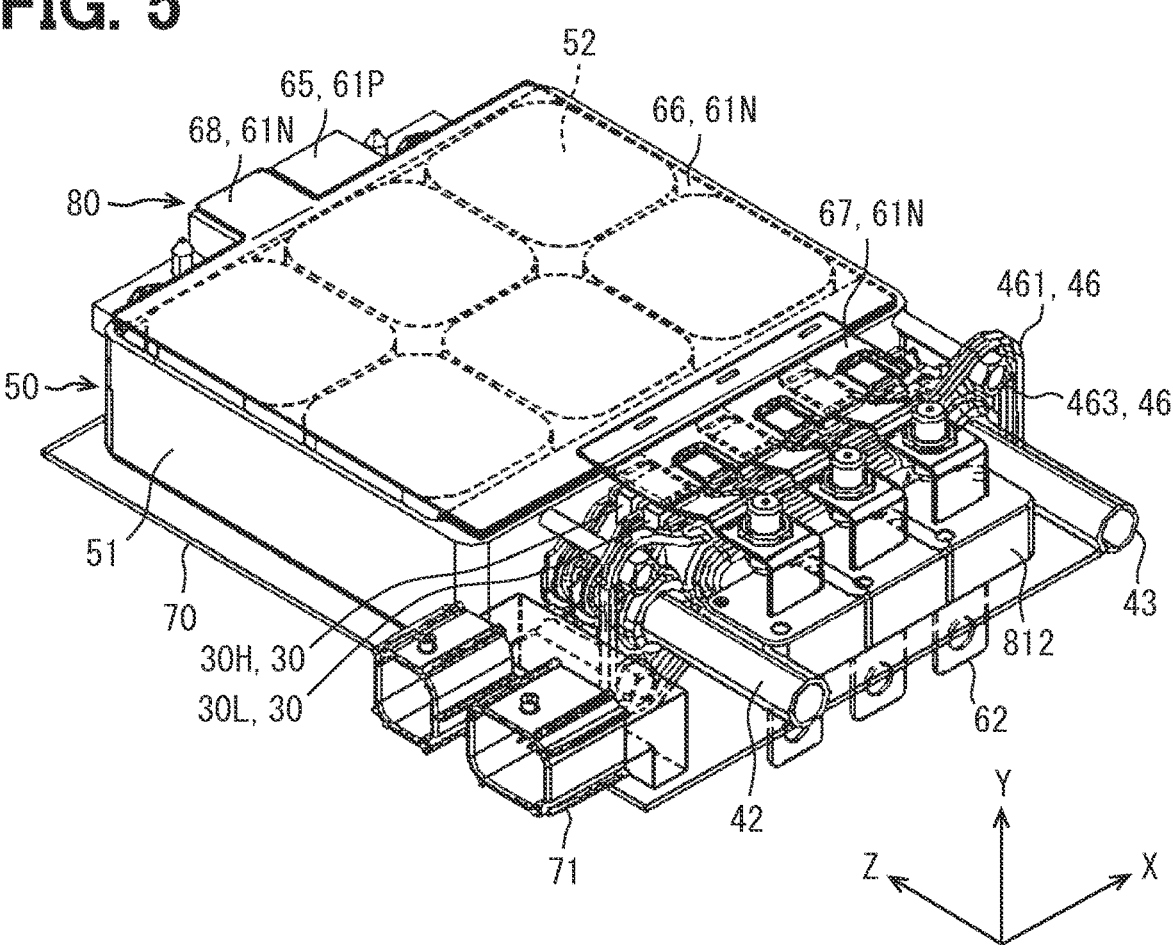
FIG. 5 is a perspective view showing a structure in a case.

FIG. 2 shows the power control apparatus 4. FIG. 3 is an inverted view of FIG. 2. FIG. 4 is an exploded perspective view. FIG. 5 shows a structure in the case 20. In FIG. 5, the case 20 is omitted compared to FIG. 2. In FIGS. 2 to 5, the inside is shown transparently.

As shown in FIGS. 2 to 5, the power control apparatus 4 includes the case 20, a plurality of semiconductor modules 30, a cooler 40, a capacitor module 50, bus bars 60, a circuit board 70, and the like.

In the following, a stacking direction of the semiconductor modules 30 and heat exchange members 41 of the cooler 40 is referred to as a Z-direction. A direction in which the semiconductor modules 30 on the same arm are arranged in side by side is orthogonal to the Z-direction and is defined as an X-direction. A direction orthogonal to both the Z-direction and the X-direction is defined as a Y-direction. The X-direction, the Y-direction, and the Z-direction are arranged to be orthogonal to each other.

<Case>

The case 20 accommodates other elements forming the power control apparatus 4. The case 20 is, for example, a molded member made of die-cast aluminum. As shown in FIGS. 2 to 4, the case 20 of this embodiment has a box shape having an opening of one side. The case 20 opens at one side in the Y-direction. The case 20 has a bottom wall 21 and side walls 22. The bottom wall 21 has a substantially rectangular shape in a plan view. The side wall 22 is connected to the bottom wall 21 and extends from the bottom wall 21 in the Y-direction. The side wall 22 is continuous with each of the four sides of outer peripheral edges of the bottom wall 21. The side wall 22 has a substantially rectangular ring shape when viewed from above in the Y-direction. The case 20 has four side walls 22.

The case 20 has through holes 23 and 24 in one of the side walls 22. Pipes 42 and 43 of the cooler 40 are inserted into the through holes 23 and 24. The through holes 23 and 24 penetrate inside and outside of the side surface 22, and are open to the inner surface and the outer surface. The case 20 has openings (not shown) to allow connectors 71 and 80 to be electrically connected to an outside of the power control apparatus 4. The case 20 has an opening for the connector 71 and an opening for the connector 80. The opening may be provided with, e.g., a through hole or a notch provided in the side wall 22.

The power control apparatus 4 may include a cover (lid) that closes an opening on one side of the case 20 together with the case 20. The case 20 and the cover may be referred to as a housing member. In a configuration without a cover, the elements accommodated in the case 20 may be liquid-tightly encapsulated and sealed by placing a filler member such as a potting resin in the case 20. In a configuration including a cover, an interior of the housing member may be liquid-tightly encapsulated and sealed by arranging sealing material members to an opposing portion between the case 20 and the cover, an opposing portion between the wall surfaces of the through holes 23 and 24 and the pipes 42 and 43, and an opposing portion between housings of the connectors 71 and 80 and the wall surface of the opening.

<Semiconductor Module>

Figure 6:
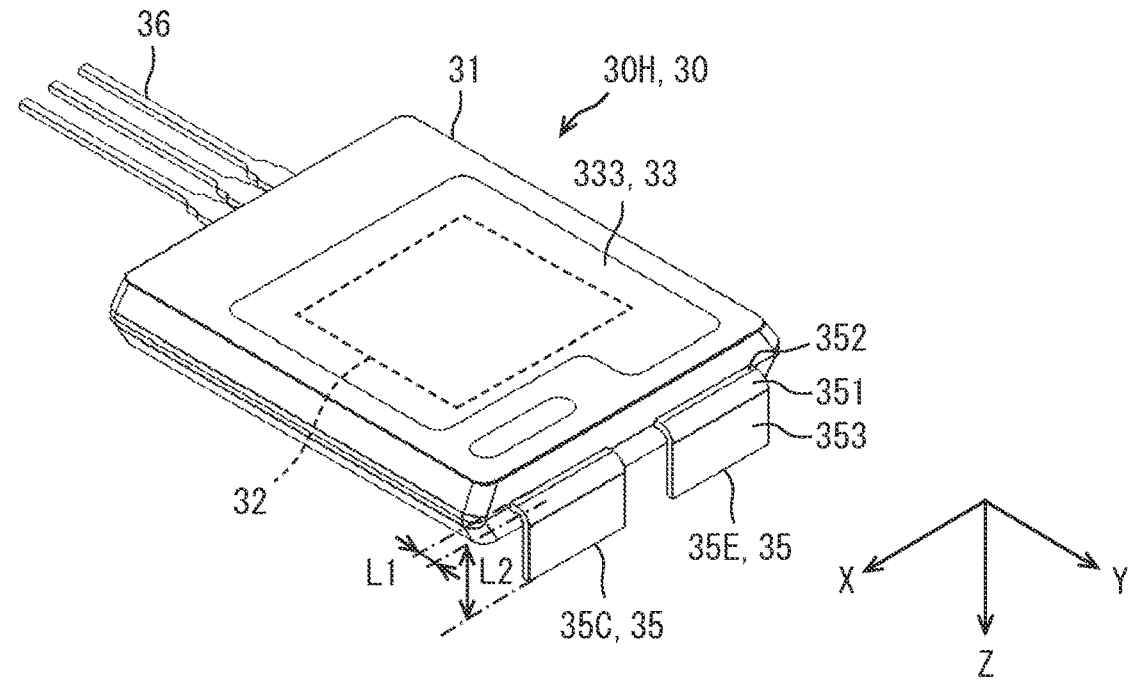
FIG. 6 is a perspective view showing a semiconductor module.
Figure 7:
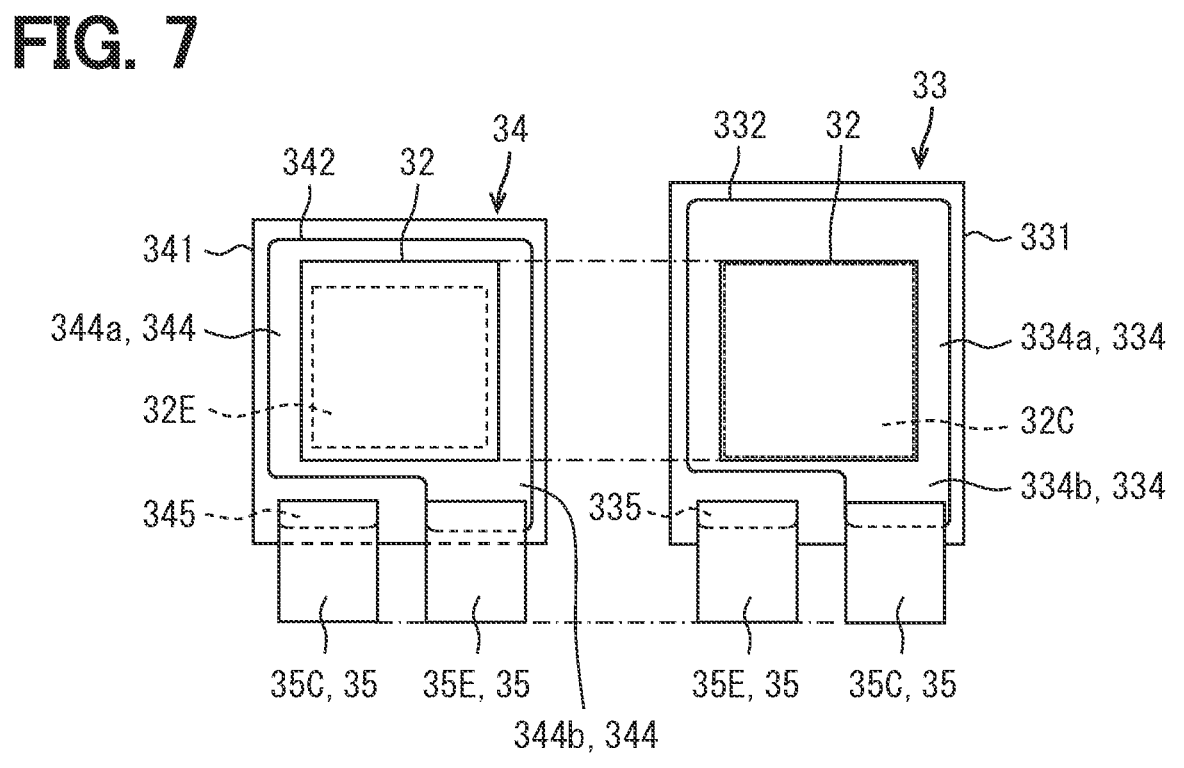

FIG. 6 shows the semiconductor module 30. FIG. 6 shows an upper arm module 30H as an example. FIG. 7 shows an arrangement of the semiconductor element 32, front metal members 332 and 342 of the substrates 33 and 34, and main terminals 35 in the semiconductor module 30. In FIG. 7, in order to make the arrangement easier to understand, the substrate 34 is shown inverted by 180 degrees with respect to the substrate 33, and the front metal members 332 and 342 of the substrates 33 and 34 are shown on the same plane.

The plurality of semiconductor modules 30 constitute the above-mentioned upper and lower arm circuit 10, i.e., the inverter 6 (power conversion circuit). The plurality of semiconductor modules 30 include an upper arm module 30H that constitutes an upper arm 10H, and a lower arm module 30L that constitutes a lower arm 10L.

In this embodiment, one semiconductor module 30 constitutes one arm 10H and 10L. As shown in FIG. 4 etc., the plurality of semiconductor modules 30 include three upper arm modules 30H that configure an upper arm 10H for three phases, and three lower arm modules 30L that configure a lower arm 10L for three phases. Furthermore, all semiconductor modules 30 have a common structure. As shown in FIGS. 6 and 7, each semiconductor module 30 includes a sealing member 31, a semiconductor element 32, a substrate 33 or 34, main terminals 35, and signal terminals 36.

The sealing member 31 encapsulates and seals a part of other elements constituting the semiconductor modules 30. The rest of the other components are exposed to the outside of the sealing member 31. The sealing member 31 includes, e.g., resin. The sealing member 31 is molded by, e.g., a transfer molding method using resin as an epoxy material. The sealing member 31 may be formed using, e.g., gel. The gel is filled (disposed) in, e.g., an opposing region of a pair of substrates 33 and 34.

The semiconductor element 32 includes a switching element formed on a semiconductor substrate which is made of a material such as silicon (Si), a wide bandgap semiconductor having a wider bandgap than silicon, or the like. The switching element has a vertical structure so that the main current flows in the thickness direction of the semiconductor substrate. Examples of the wide bandgap semiconductor include silicon carbide (SiC), gallium nitride (GaN), gallium oxide (Ga$_2$O$_3$) and diamond. The semiconductor element 32 may be referred to as a power element or a semiconductor chip.

The semiconductor element 32 of this embodiment is formed by forming the above-mentioned n-channel type IGBT 12 and FWD 13, i.e., RC (Reverse Conducting)-IGBT, on a semiconductor substrate made of Si. The IGBT 12 has a vertical structure so that the main current flows in the thickness direction of the semiconductor element 32, i.e., semiconductor substrate. The semiconductor element 32 has main electrodes of switching element on both sides in the thickness direction thereof. Specifically, as the main electrodes, an emitter electrode 32E is provided on a front surface, and a collector electrode 32C is provided on a back surface. The emitter electrode 32E is formed on a part of the front surface. The collector electrode 32C is formed on almost the entire surface of the back surface. In FIG. 7, the collector electrode 32C and the emitter electrode 32E are shown by broken lines.

The main current flows between the collector electrode 32C and the emitter electrode 32E. The semiconductor element 32 has pads (not shown), which are signal electrodes, on the surface where the emitter electrode 32E is formed. The semiconductor element 32 is arranged so that its thickness direction is substantially parallel to the Z-direction. The semiconductor module 30 of this embodiment includes one semiconductor element 32.

The substrates 33 and 34 are arranged to sandwich the semiconductor element 32 in the thickness direction of the semiconductor element 32, i.e., in the Z-direction. The substrates 33 and 34 are arranged so that at least parts thereof are opposed to each other in the Z-direction. The substrates 33 and 34 include all of the semiconductor element 32 that constitute one of the arm 10H or 10L in a plan view in the Z-direction.

The substrates 33 and 34 are electrically connected to the semiconductor element 32. The substrate 33 is arranged on a side of the collector electrode 32C with respect to the semiconductor element 32. The substrate 34 is arranged on a side of the emitter electrode 32E with respect to the semiconductor element 32. The substrate 33 is electrically connected to the collector electrode 32C and provides a wiring function. Similarly, the substrate 34 is electrically connected to the emitter electrode 32E and provides a wiring function. The substrates 33 and 34 provides a heat dissipation function of dissipating heat generated at the semiconductor element 32.

The substrate 33 includes an insulating base member 331, a front metal member 332, and a back metal member 333. The front metal member 332 is arranged on a surface of the insulating base member 331 on a side to the semiconductor element 32. The back metal member 333 is disposed on the back surface of the insulating base member 331. The substrate 34 includes an insulating base member 341, a front metal member 342, and a back metal member 343. The front metal member 342 is arranged on a surface of the insulating base member 341 on a side to the semiconductor element 32. The back metal member 343 is disposed on the back surface of the insulating base member 341. The substrates 33 and 34 are laminated substrates of an insulating base member and a metal member. Hereinafter, the front metal member 332 and 342 and the back metal member 333 and 343 may be each simply referred to as the metal member 332, 333, 342, and 343.

The insulating base member 331 electrically isolates the metal members 332 and 333. Similarly, the insulating base member 341 electrically isolates the metal members 342 and 343. Material of the insulating base member 331 and 341 is resin, or an inorganic material such as ceramic. Material configurations of the insulating base members 331 and 341 may be common (same) or different from each other.

The metal members 332, 333, 342, and 343 may be provided, e.g., as a metal plate or a metal foil. The metal members 332, 333, 342, and 343 are formed by using a material which is a metal having favorable conductivity and thermal conductivity, such as Cu or Al. The front metal members 332 and 342 provide a wiring line, i.e., a circuit.

The front metal members 332 and 342 of this embodiment are patterned. As shown in FIG. 7, the front metal member 332 has a wiring portion 334 that provides an electric wiring function and a dummy wiring section 335 that does not provide an electric wiring function. The wiring portion 334 electrically connects the collector electrode 32C of the semiconductor element 32 and the corresponding main terminal 35, i.e., the collector terminal 35C. The wiring portion 334 has a substantially L-shape in a plan view, and includes a base portion 334a that is substantially rectangular in a plan view and a protruding portion 334b extended in the Y-direction from one side of the base portion. A collector electrode 32C is connected to the base portion 334a of the wiring portion 334, and a collector terminal 35C is connected to the protruding portion 334b.

The dummy wiring portion 335 is electrically isolated from the wiring portion 334. The dummy wiring portion 335 is provided so as to be aligned with the protruding portion 334b of the wiring portion 334 in the X-direction. The emitter terminal 35E, which is the main terminal 35, is connected to the dummy wiring portion 335. The dummy wiring portion 335 supports the emitter terminal 35E.

Similar to the front metal member 332, the front metal member 342 includes a wiring portion 344 that provides an electric wiring function and a dummy wiring portion 345 that does not provide an electric wiring function. The wiring section 344 electrically connects the emitter electrode 32E of the semiconductor element 32 and the corresponding main terminal 35, i.e., the emitter terminal 35E. The wiring portion 344 has a substantially L-shape in a plan view, and includes a base portion 344a that is substantially rectangular in a plan view and a protruding portion 344b extended in the Y-direction from one side of the base portion. The emitter electrode 32E is connected to the base portion 334a of the wiring portion 344, and the emitter terminal 35E is connected to the protruding portion 344b.

The dummy wiring portion 345 is electrically isolated from the wiring portion 344. The dummy wiring portion 345 is provided so as to be aligned with the protruding portion 344b of the wiring portion 344 in the X-direction. The collector terminal 35C, which is the main terminal 35, is connected to the dummy wiring portion 345. The dummy wiring portion 335 supports the collector terminal 35C.

The front metal member 332 and the front metal member 342 are arranged in a horizontally reversed arrangement in a plan view from the Z-direction. In the X-direction, the arrangement of the protruding portion 334b and the dummy wiring portion 335 is opposite to the arrangement of the protruding portion 344b and the dummy wiring portion 345.

The back metal members 333 and 343 are electrically isolated from the circuit including the semiconductor element 32 and the front metal members 332 and 342 by the insulating base members 331 and 341. Heat generated at the semiconductor element 32 is transferred to the back metal members 333 and 343 via the front metal members 332 and 342 and the insulating base members 331 and 341. The back metal members 333 and 343 provide a heat dissipation function. The back metal members 333 and 343 may be patterned to substantially match the corresponding front metal members 332 and 342 in plan view, or may have a pattern different from the front metal members 332 and 342.

It may be a so-called solid pattern that almost matches the insulating base members 331 and 341. In this embodiment, the pattern of the back metal member 333 almost matches the front metal member 332, and the pattern of the back metal member 343 almost matches the front metal member 342.

In order to further enhance a heat dissipation effect, at least one of the back metal members 333 and 343 may be exposed from the sealing member 31. In this embodiment, the back metal member 333 is exposed from one surface of the sealing member 31, and the back metal member 343 is exposed from the other surface of the sealing member 31.

Note that the wiring member that electrically connects the main electrode of the semiconductor element 32 and the main terminal 35 is not limited to the substrates 33 and 34 described above. For example, a heat sink made of a metal plate may be used. The heat sink also provides the heat dissipation function described above. The heat sink is provided as a part of a lead frame together with, e.g., the main terminals 35 and the signal terminals 36. If a heat sink is exposed from the sealing member 31, the heat sink and the heat exchange member 41 can be electrically separated by placing an insulating member such as a ceramic plate between it and the heat exchange member 41 of the cooler 40.

The main terminals 35 are external connection terminals electrically connected to the main electrodes of the semiconductor element 32. The main terminals 35 include the collector terminal 35C electrically connected to the collector electrode 32C and the emitter terminal 35E electrically connected to the emitter electrode 32E. The collector terminal 35C is connected to the collector electrode 32C via the wiring portion 334 of the front metal member 332. The emitter terminal 35E is connected to the emitter electrode 32E via the wiring portion 344 of the front metal member 342. The emitter terminal 35E corresponds to a first main terminal connected to the front surface of the semiconductor element 32, i.e, the emitter electrode 32E. The collector terminal 35C corresponds to a second main terminal connected to the back surface of the semiconductor element 32, i.e., the collector electrode 32C.

Each one of the main terminals 35 are extended in the Y-direction and has a portion disposed over both inside and outside of the sealing member 31. Each main terminal 35 protrudes outward from one of the side surfaces of the sealing member 31 in the Y-direction. The protruding portion of the collector terminal 35C and the protruding portion of the emitter terminal 35E are arranged in parallel in the X-direction. The protruding portion of the main terminal 35 may have only a portion extending in the Y-direction, or may be bent in a middle.

As shown in FIG. 6, the protruding portion of this embodiment has a bent portion 351, a root portion 352, and a distal end portion 353, respectively. The root portion 352 is a part of the protruding portion from the sealing member 31 to the bent portion 351. A thickness direction of the root portion 352 is approximately parallel to the Z-direction, and the root portion 352 extends in the Y-direction. The distal end portion 353 is a portion from the bent portion 351 to a distal end of the protruding portion. A thickness direction of the distal end portion 353 is approximately parallel to the Y-direction, and the distal end portion 353 extends in the Z-direction. The protruding portion of the main terminal 35 is bent at an angle of approximately 90 degrees at a bent portion 351, and is approximately L-shaped in a Y-Z plane.

An extended length L1 of the root portion 352 may be shorter or longer than an extended length L2 of the distal end portion 353. The extended lengths L1 and L2 may be equal to each other. In this embodiment, the extended length L1 of the root portion 352 is shorter than the extended length L2 of the distal end portion 353. That is, the protruding portion of the main terminal 35 is bent near the sealing member 31.

The distal end portion 353 may extend toward or away from the capacitor module 50 in the Z direction. The distal end portion 353 of the collector terminal 35C and the distal end portion 353 of the emitter terminal 35E, in a single one of the semiconductor module 30, may be arranged along one direction perpendicular to the stacking direction. The one direction may be the X-direction. The collector terminal 35C and the emitter terminal 35E are arranged on a line along the X-direction. The collector terminal 35C and the emitter terminal 35E may be deviate slightly from a single line along the X-direction. The collector terminal 35C and the emitter terminal 35E are arranged in parallel but are arranged in a shifted manner along the X-direction. The distal end portion 353 of the collector terminal 35C and the distal end portion 353 of the emitter terminal 35E, in the common semiconductor module 30, may extend in the same direction. Alternatively, the distal end portion 353 of the collector terminal 35C and the distal end portion 353 of the emitter terminal 35E, in the common semiconductor module 30, may extend in opposite directions. In this embodiment, the distal end portion 353 of the collector terminal 35C and the distal end portion 353 of the emitter terminal 35E extend in the same direction.

The signal terminals 36 are external connection terminals electrically connected to the main electrodes of the semiconductor element 32. The signal terminals 36 extend in the Y-direction and protrude to the outside from a side of the sealing member 31 at a side opposite to the side from which the main terminals 35 protrude.

The connection form between the signal terminals 36 and the pads are not particularly limited. It may be made using a bonding wire. If a bonding wire is used, it is possible to keep a height of the bonding wire by placing a conductive spacer between the substrate 34 and the emitter electrode 32E of the semiconductor element 32. Other wiring members may be used instead of a bonding wire. It may be made via a bonding material such as solder.

<Cooler>

Figure 8:
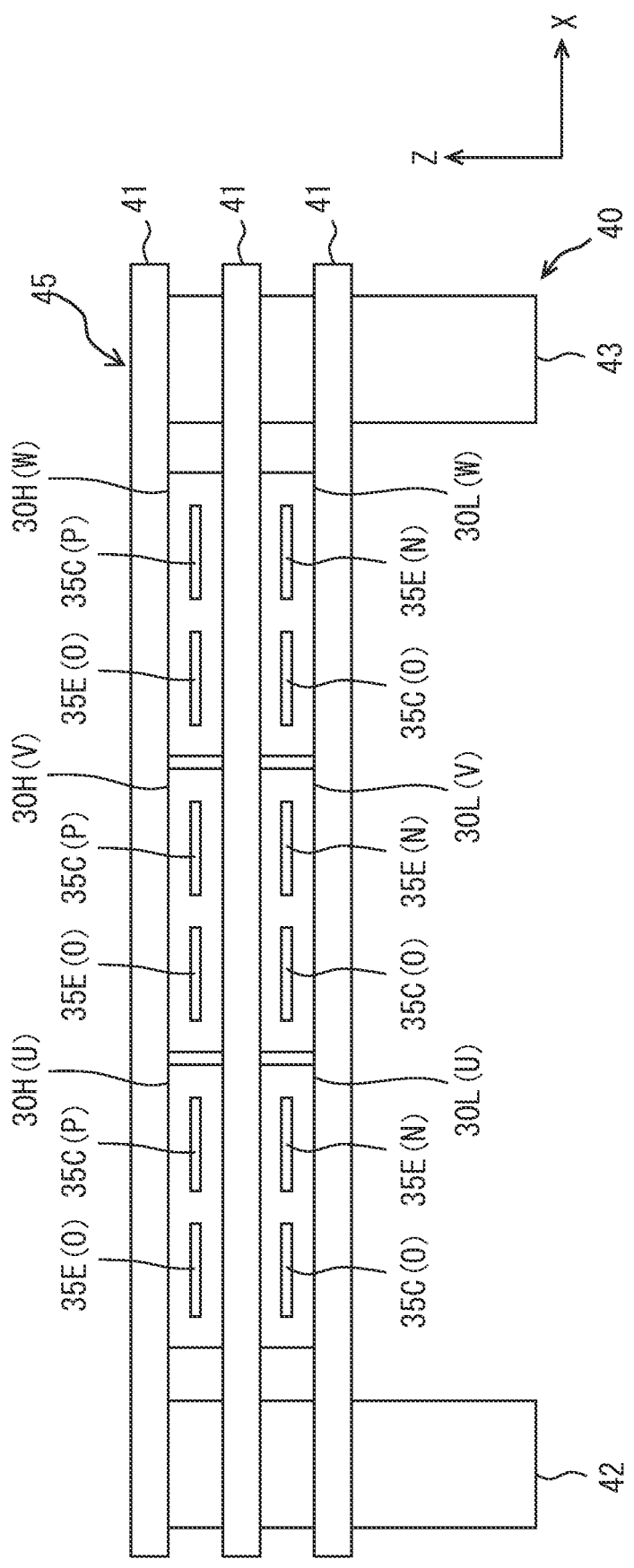
FIG. 8 is a plan view showing a stacked unit.
Figure 9:
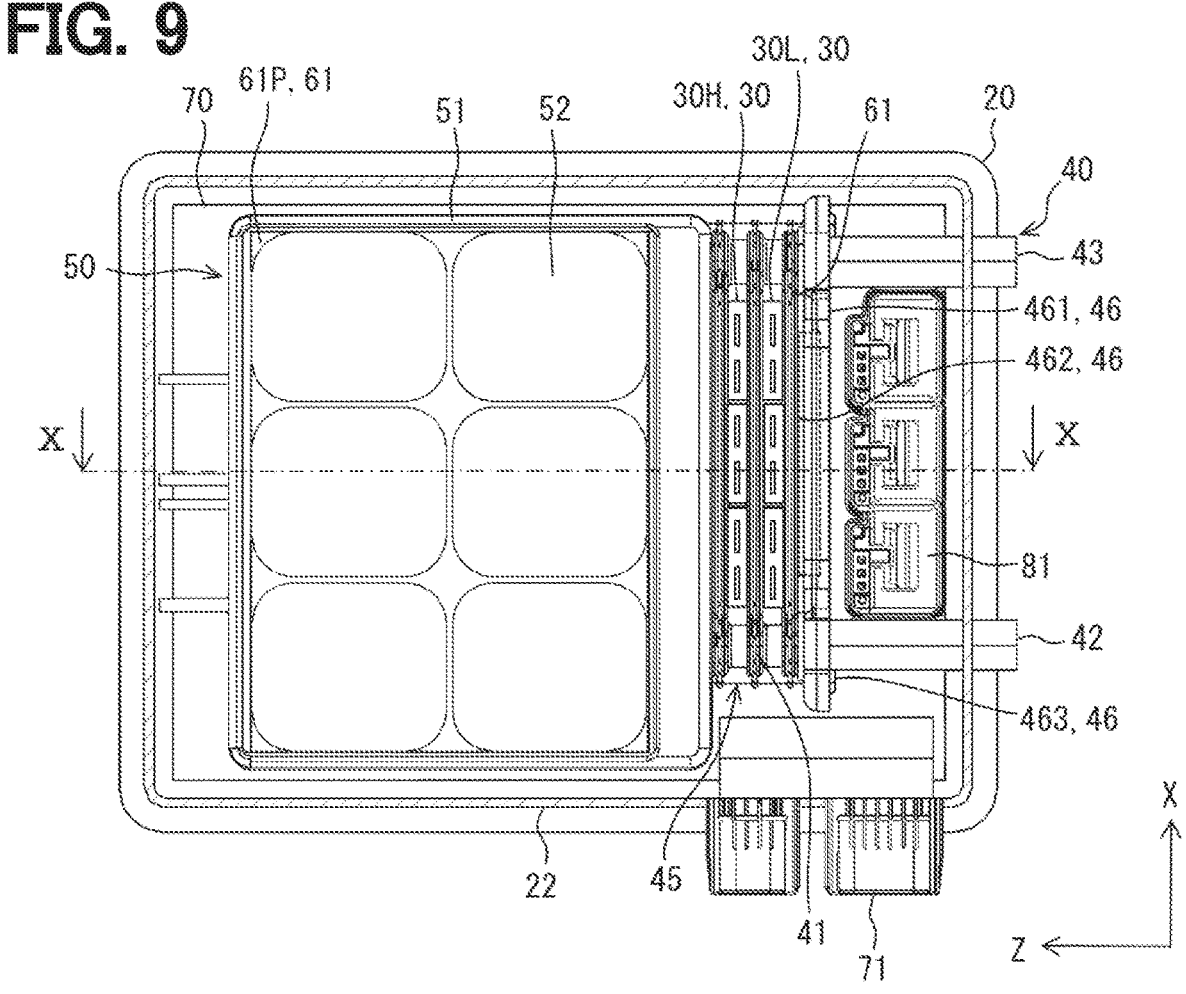
FIG. 9 is a plan view showing an arrangement of semiconductor modules, a cooler, and capacitors.

FIG. 8 shows the arrangement of the semiconductor module 30 and the cooler 40. In FIG. 8, a structure of the main terminals 35 is illustrated in a simplified manner for convenience. FIG. 9 is a plan view showing an arrangement of the semiconductor modules 30, the cooler 40, and the capacitor module 50. In FIG. 9, for convenience, the case 20 is shown in cross section, and elements such as the bus bars 60 are omitted.

The cooler 40 is formed of a material having excellent thermal conductivity, e.g., an aluminum-based material. As shown in FIGS. 4, 8, 9, etc., the cooler 40 includes the heat exchange members 41, a pipe 42 for introducing, and a pipe 43 for discharging.

The heat exchange member 41 is a flat tubular member as a whole. The heat exchange member 41 is configured to have, e.g., a pair of plates, i.e., thin metal plates, to define a flow path therebetween. At least one of the pair of plates is pressed into a shape that bulges in the Z-direction. After that, the outer peripheral edges of the pair of plates are fixed to each other by crimping or the like, and are joined to each other on the entire circumference by brazing or the like. As a result, a flow path through which the refrigerant can flow is formed between the pair of plates, and it is possible to use them as the heat exchange member 41.

The heat exchange members 41 are arranged in multiple stages in the Z-direction so as to cool each of the semiconductor modules 30 from both sides. The heat exchange members 41 sandwich the semiconductor module 30 in the Z-direction. The heat exchange members 41 constitute a stacked unit 45 together with the semiconductor modules 30.

Each of the pipes 42 and 43 is arranged over an inside and an outside of the case 20. Each of the pipe 42 for introducing and the pipe 43 for discharging may be configured by single member or may be configured by connecting a plurality of members. The pipes 42 and 43 are connected to each of the heat exchange members 41. If a pump (not shown) is driven, a cooling fluid is supplied to the pipe 42, and the cooling fluid flows into a flow path of each of the heat exchange members 41 arranged in multiple stages. Thereby, each of the semiconductor modules 30 is cooled. The cooling fluid flowing through each of the heat exchange members 41 is discharged via the pipe 43. A phase-changing refrigerant such as water or ammonia or a non-phase-changing refrigerant such as ethylene glycol may be used as the cooling fluid.

<Arrangement of Multiple Semiconductor Modules>

As shown in FIG. 8 etc., the semiconductor modules 30 and the heat exchange members 41 are arranged alternately in the stacked unit 45. The heat exchange members 41 are arranged at both ends of the stacked unit 45. In the stacked unit 45, the heat exchange members 41 are arranged in three stages in the Z-direction. Here, the heat exchange member 41 closest to the capacitor module 50 is referred to as a first stage, the heat exchange member 41 on a middle is referred to as a second stage, and the heat exchange member 41 further away from the capacitor module 50 is referred to as a third stage.

In the stacked unit 45, the upper arm modules 30H are arranged between the first heat exchange member 41 and the second heat exchange member 41. The three upper arm modules 30H constituting the three-phase upper arm 10H are arranged side by side in the X-direction with the same orientation. The three upper arm modules 30H are arranged side by side in an order of U phase, V phase, and W phase. The collector terminal 35C of each upper arm module 30H functions as a P-terminal electrically connected to the positive electrode of the capacitor element 52. The P-terminal may be referred to as a positive electrode terminal or a high-potential power supply terminal. The emitter terminal 35E of each upper arm module 30H functions as an O-terminal electrically connected to the winding 3a of the corresponding phase of the motor generator 3. The O-terminal may be referred to as an output terminal, an AC terminal, or the like.

In the stacked unit 45, the lower arm modules 30L are arranged between the second heat exchange member 41 and the third heat exchange member 41. The three lower arm modules 30L constituting the three-phase lower arm 10L are arranged side by side in the X-direction with the same orientation. The three lower arm modules 30L are arranged in the same order as the upper arm modules 30H. The collector terminal 35C of each lower arm module 30L functions as the O-terminal. The emitter terminal 35E of each lower arm module 30L functions as an N-terminal electrically connected to the negative electrode of the capacitor element 52. The N-terminal may be referred to as a negative electrode terminal or a low-potential power supply terminal. As described above, the upper arm module 30H is arranged on a side closer to the capacitor module 50, and the lower arm module 30L is arranged on a side farther from the capacitor module 50. The lower arm module 30L corresponds to a first semiconductor module, and the upper arm module 30H corresponds to a second semiconductor module. Each semiconductor module 30 has a common structure. In the Z-direction, the upper arm module 30H and the lower arm module 30L of the same phase are arranged to be opposed to each other with the heat exchange member 41 interposed therebetween. The collector terminal 35C of the upper arm module 30H and the emitter terminal 35E of the lower arm module 30L of the same phase are arranged to be opposed to each other.

The stacked unit 45 is compressed in the Z-direction by a pressure member 46. The semiconductor modules 30 and the heat exchange members 41 are held in a good heat conduction manner by the pressure member 46. As described above, since the substrates 33 and 34 are used in this embodiment, there is no need to provide an insulating member for electrically separating the semiconductor module 30 and the heat exchange member 41. The semiconductor module 30 and the heat exchange member 41 may be in direct contact with each other, or a thermally conductive member such as a thermally conductive gel may be interposed between the semiconductor module 30 and the heat exchange member 41.

As an example, the pressure member 46 of this embodiment includes a pressure plate 461, an elastic member 462 and bolts 463. The pressure plate 461 is arranged to locate the stacked unit 45 between it and the capacitor module 50 in the Z-direction. The elastic member 462 is, e.g., a material that generates a pressing force by elastic deformation of rubber, or a metal spring. The elastic member 462 is arranged between the pressure plate 461 and the heat exchange member 41 in the third stage. The pressure plate 461 is fixed to the case 51 of the capacitor module 50 with bolts 463 while in a state where an elastic member 462 is held between the stacked unit 45.

As shown in FIG. 4, the pressure plate 461 has a substantially rectangular shape in a plan view in the Z-direction, and has through holes 464 for bolts 463 at its four corners. The pressure plate 461 is fixed to the case 51 by bolts 463 placed at four corners. The elastic member 462 is elastically deformed by fixing the pressure plate 461, and the stacked unit 45 is pressed against the case 51 by a reaction force. The stacked unit 45 is held in a compressed state between the pressure plate 461 and the case 51.

<Capacitor Module>

As shown in FIGS. 4, 5, and 9, the capacitor module 50 includes a case 51 and capacitor elements 52. The capacitor module 50. i.e., the capacitor elements 52 correspond to a capacitor. The case 51 is formed of a resin material or a metal material, and has a box shape having an opening on one side. The case 51 opens at one side in the Y-direction. The case 51 opens on a side opposite to the opening of the case 20. The case 51 has a generally rectangular planar shape with a longitudinal direction in the X-direction and a short-hand direction in the Z-direction.

The capacitor elements 52 are accommodated, i.e., arranged in the case 51. The capacitor elements 52 constitutes the smoothing capacitor 5 described above. For example, a film capacitor element can be adopted as the capacitor element 52. The number of capacitor elements 52 is not particularly limited. The number may be only one or multiple. As an example, the capacitor module 50 of this embodiment includes six capacitor elements 52. The six capacitor elements 52 are arranged in two rows in the Z-direction and three columns in the X-direction. The six capacitor elements 52 have a generally rectangular parallelepiped shape as a whole. Each capacitor element 52 has metal electrodes (not shown) at both ends in the Y-direction. In each capacitor element 52, a metal electrode on a side of a positive electrode is disposed on a bottom surface, which is an end on a side of a bottom wall of the case 51, and a metal electrode on a side of a negative electrode is disposed on a top surface, which is an end on a side of the opening of the case 51.

The capacitor module 50 may include a sealing member (not shown). The sealing member is filled into the case 51 and encapsulates and seals the capacitor element 52. The capacitor module 50 may include terminals (not shown). The terminal is, e.g., a plate-shaped metal member connected to the metal electrode of the capacitor element 52.

As shown in FIGS. 5, and 9 etc., the capacitor module 50 is arranged on one end side of the stacked unit 45 in the Z-direction. In a plan view in the Z-direction, the capacitor module 50 is arranged so as to overlap the stacked unit 45.

<Bus Bar>

Figure 10:
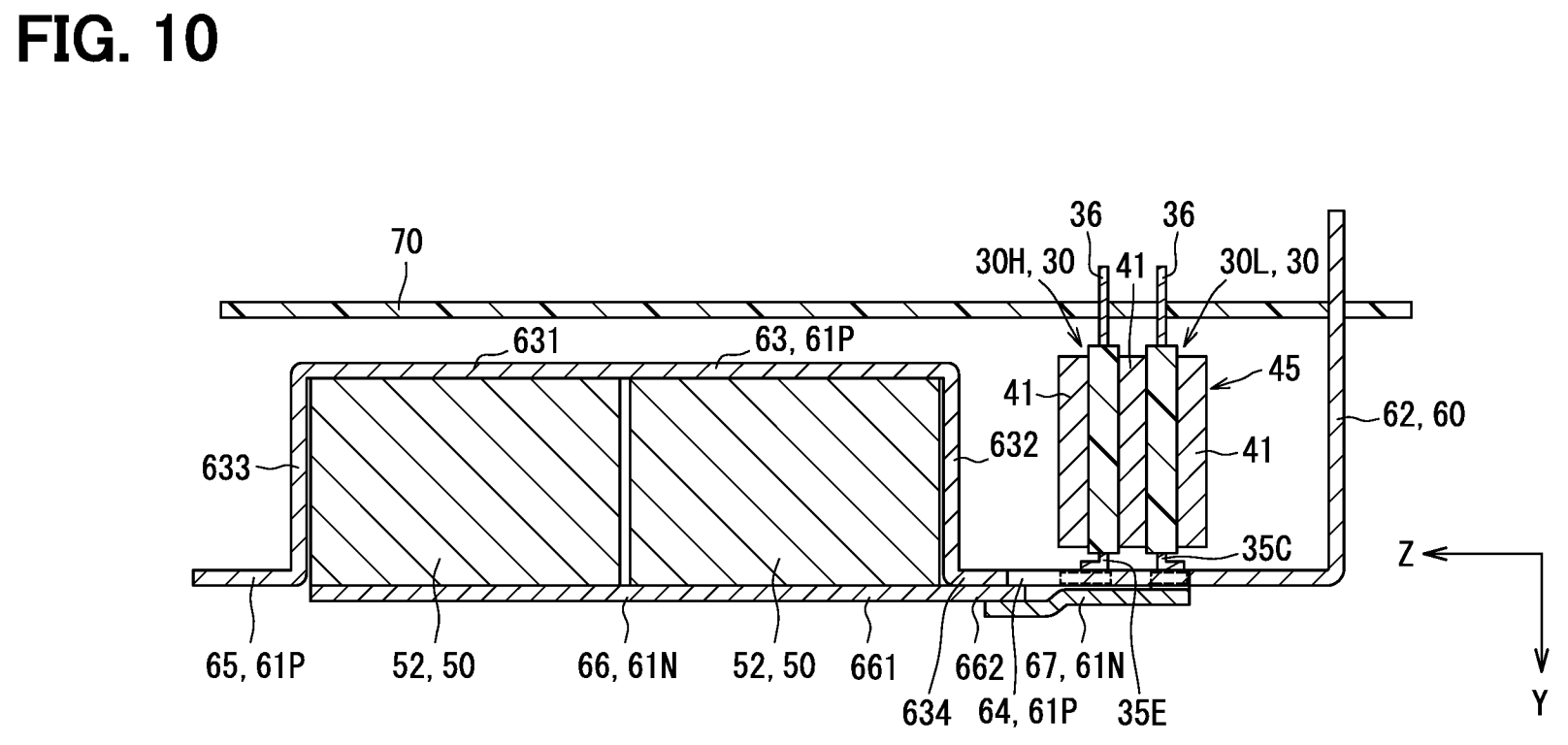
Figure 11:
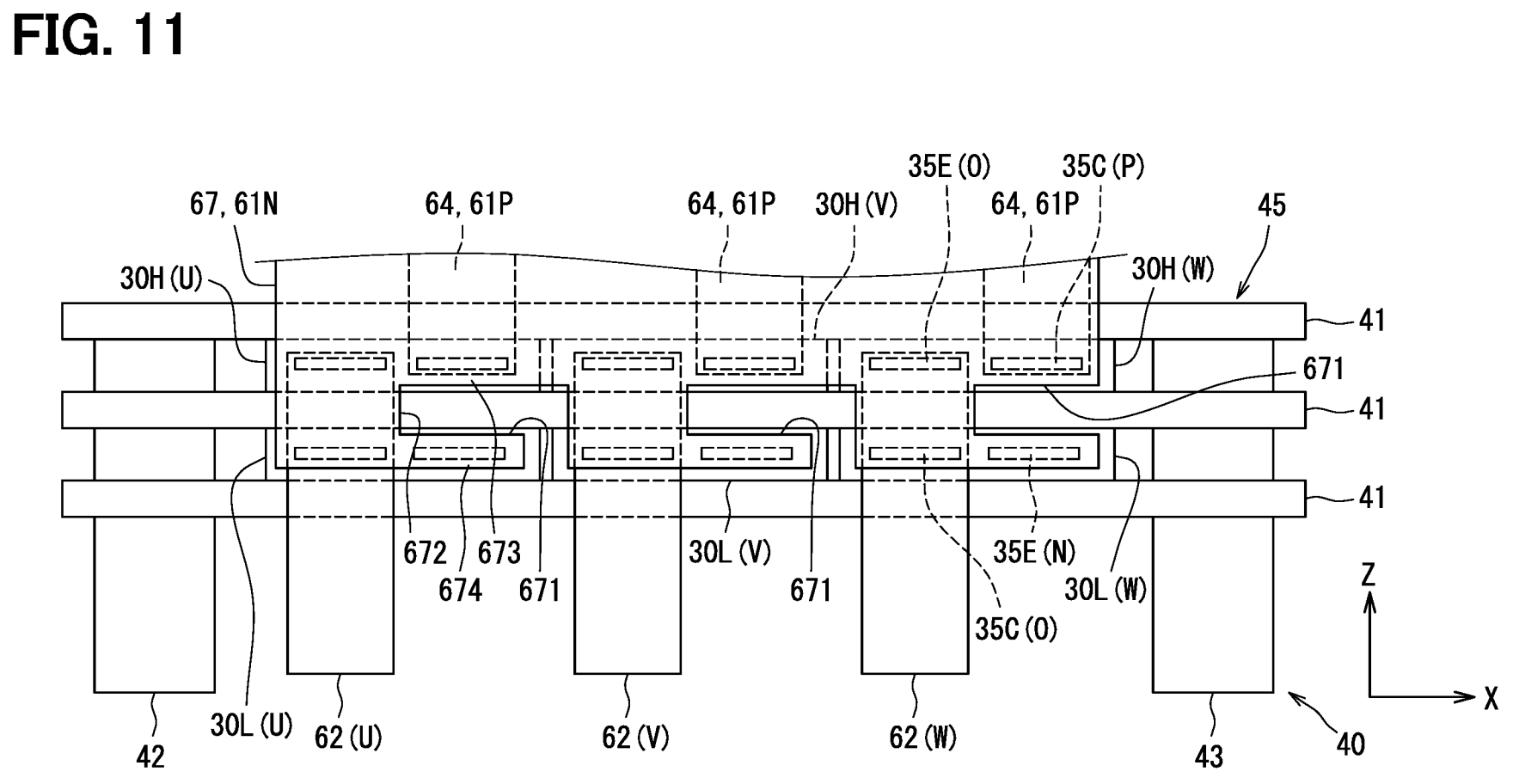
Figure 12:
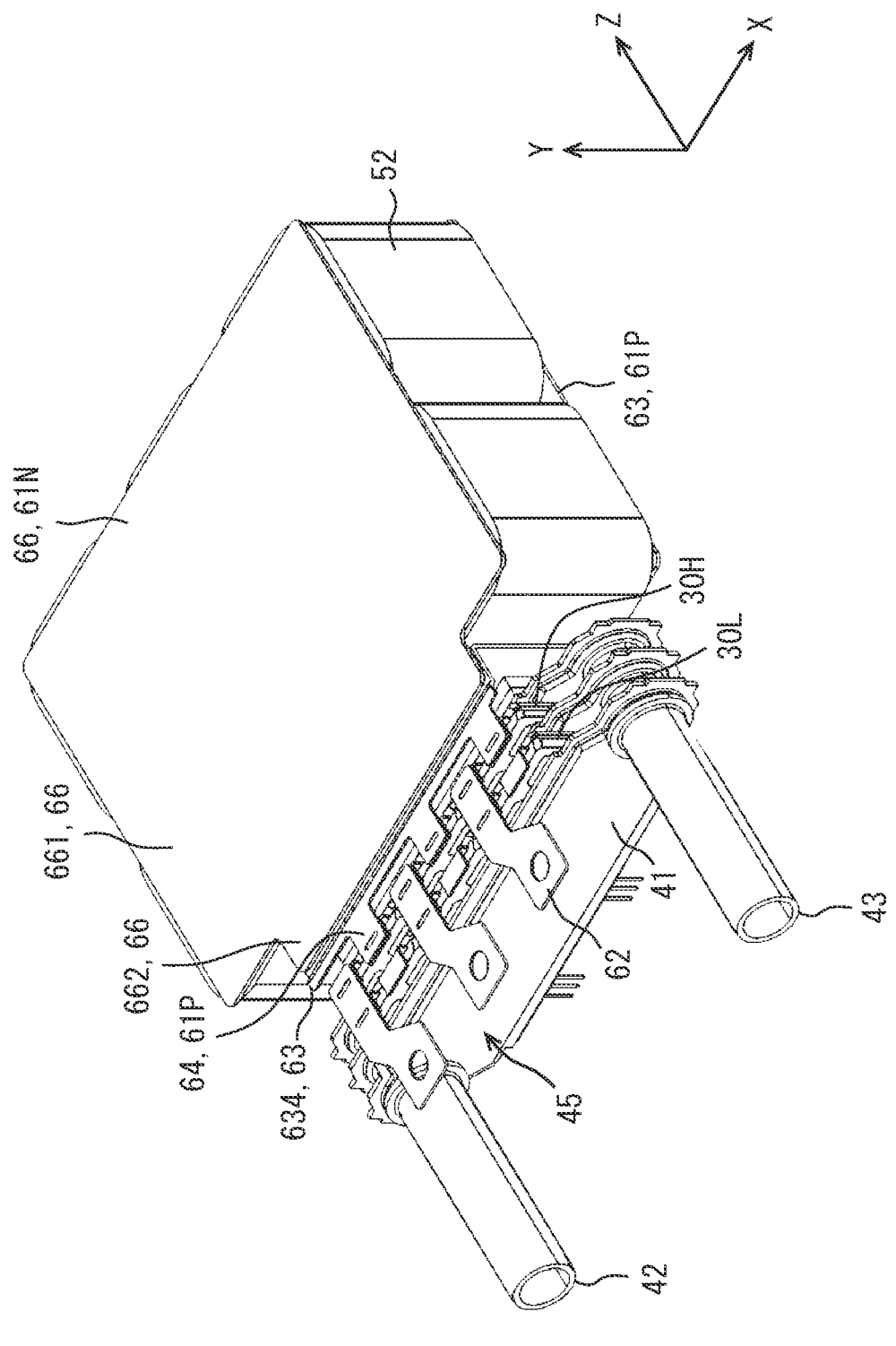
FIG. 12 is a perspective view showing a state before connecting extended portions of a negative bus bar.
Figure 13:
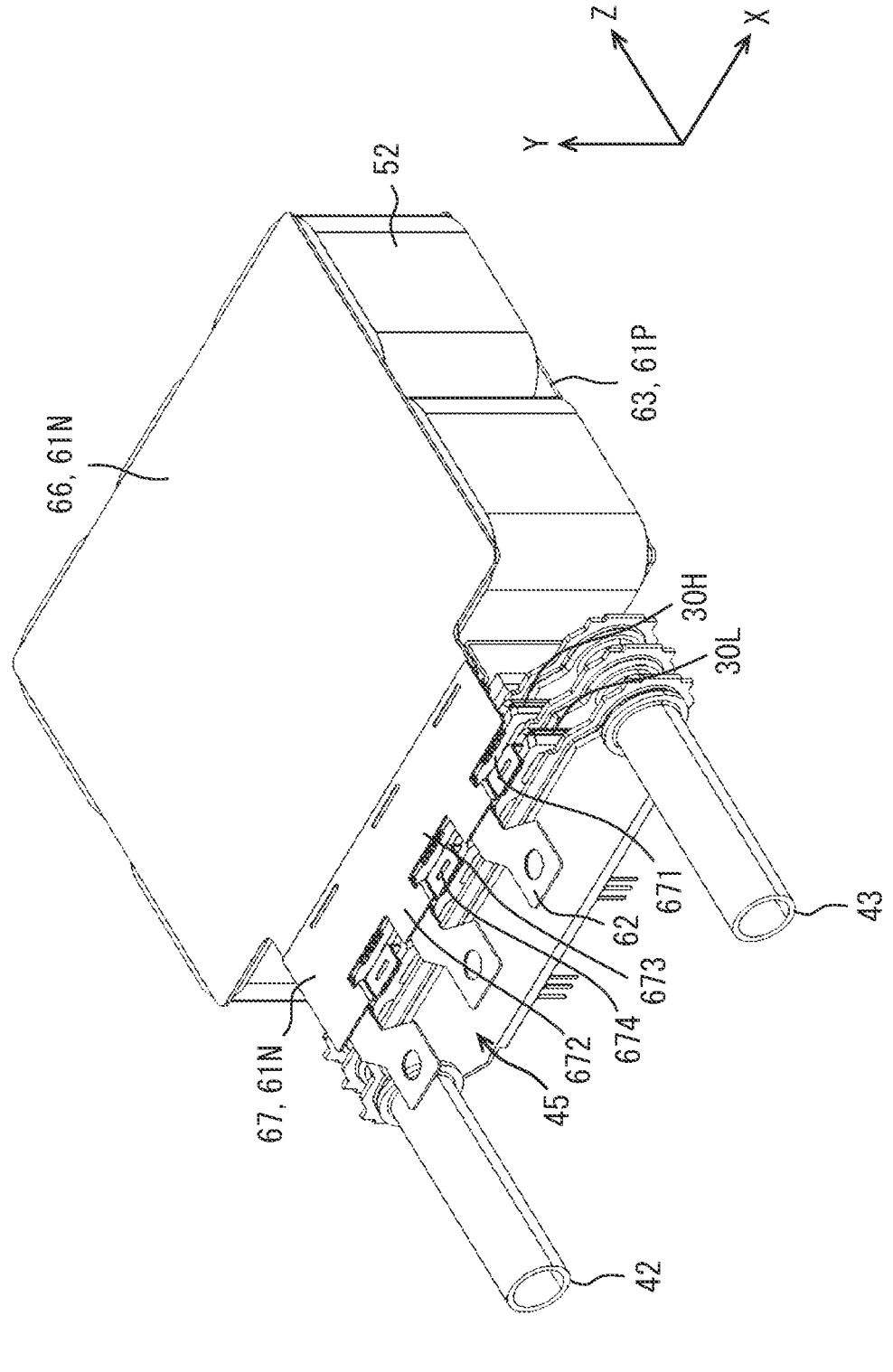
FIG. 13 is a perspective view showing a state after connecting extended portions of a negative bus bar.

FIG. 10 is a cross-sectional view taken along line X-X in FIG. 9. In FIG. 10, for convenience, the stacked unit 45, the capacitor element 52, the bus bars 60, and the circuit board 70 are selectively illustrated. FIG. 11 is a plan view showing an arrangement of each bus bar 60. FIG. 11 corresponds to FIG. 8. FIG. 12 shows a state before arranging the extended portion 67 of the negative bus bar 61N, and FIG. 13 shows a state after arranging the extended portion 67. In FIGS. 12 and 13, for convenience, the extended portion 65 of the positive bus bar 61P and the extended portion 68 of the negative bus bar 61N are omitted.

The bus bars 60 are wiring members electrically connected to the semiconductor modules 30. The bus bars 60 are plate-shaped metal members. The bus bars 60 are connected to the corresponding main terminals 35 by solder joining, resistance welding, laser welding, or the like. As shown in FIGS. 4, 10, 11, etc., the bus bars 60 include a power bus bars 61 and an output bus bars 62.

The power bus bars 61 electrically connect the semiconductor modules 30 and the capacitor elements 52. The power bus bars 61 include a positive bus bar 61P and a negative bus bar 61N. The positive bus bar 61P electrically connects each of the collector terminals 35C, i.e., the P-terminals of the upper arm modules 30H to the positive electrode of the capacitor elements 52. The positive bus bar 61P may be referred to as a P-bus bar, a high potential power supply bus bar, or the like. The positive bus bar 61P constitutes at least a part of the—line 8 described above. The positive bus bar 61P corresponds to a second power supply bus bar.

The positive bus bar 61P has a base portion 63 and extended portions 64 and 65. The base portion 63 is connected to the positive electrode of the capacitor elements 52. The base portion 63 is disposed within the case 51 and includes a portion opposing the bottom wall of the case 51 and two side walls in the Z-direction. The base portion 63 is placed to be opposed to an entirety of the capacitor elements 52 having a substantially rectangular parallelepiped shape at three surfaces. The base portion 63 has a bottom opposing portion 631, side opposing portions 632 and 633, and a bent portion 634.

The bottom opposing portion 631 is opposed to the bottom surface of the capacitor elements 52. The side surface opposing portion 632 is opposed to the side surface of the capacitor element 52 on a side of the stacked unit 45. The side opposing portion 633 is opposed to the side surface of the capacitor elements 52 on a side opposite to the side opposing portion 632 in the Z-direction. The bent portion 634 is bent at an angle of approximately 90 degrees with respect to the side opposing portion 632. The bent portion

634 is connected to the side surface opposing portion 632 and extends from the side surface opposing portion 632 to a side of the stacked unit 45, i.e., in the Z-direction. The bent portion 634 is arranged outside the case 51.

The extended portion 64 is continuous with the bent portion 634 of the base portion 63 and extends in the Z-direction. The width of the extended portion 64 is narrower than the width of the base portion 63. The positive bus bar 61P has three extended portions 64 corresponding to each phase. The three extended portions 64 extend in the same direction from the bent portion 634 common for the extended portions 64. The three extended portions 64 are arranged side by side in the X-direction. A plate thickness direction of the extended portion 64 is approximately parallel to the Y-direction. A plate surface of the extended portion 64 is opposed to a plate surface of the distal end portion 353 of the collector terminal 35C of the upper arm module 30H. The extended portion 64 is connected to the collector terminal 35C of the upper arm module 30H at a portion where the plate surfaces are opposed to each other. Each one of the extended portions 64 straddles (crosses) the first stage of the heat exchange member 41 in the Z-direction.

The extended portion 65 is connected to the base portion 63 at an opposite side where the extended portion 64 is connected. The extended portion 65 extends from the base portion 63 in a direction which is opposite to the extended portion 64. A width of the extended portion 65 is narrower than a width of the base portion 63. The extended portion 65 constitutes a connector 80 for connecting to the DC power supply 2. The extended portion 65 is a positive terminal of the connector 80. The positive bus bar 61P having the above configuration may be formed, e.g., by processing a single metal plate, or may be formed by connecting (joining) a plurality of members.

The negative bus bar 61N electrically connects each of the emitter terminals 35E, i.e., the N-terminals of the lower arm modules 30L and the negative electrode of the capacitor elements 52. The negative bus bar 61N may be referred to as an N-bus bar, a low potential power supply bus bar, or the like. The negative bus bar 61N constitutes at least a part of the N-line 9. The negative bus bar 61N corresponds to a first power supply bus bar.

The negative bus bar 61N has a base portion 66 and extended portions 67 and 68. The base portion 66 is connected to the negative electrode of the capacitor elements 52. At least a part of the base portion 66 is located outside the case 51. The base portion 66 has a covering portion 661 and an opposing portion 662. The covering portion 661 is arranged so as to cover the entire capacitor element 52 having a substantially rectangular parallelepiped shape in a view in the Y-direction. The covering portion 661 is opposed to the upper surface of the capacitor elements 52 and is connected to the negative electrode. The opposing portion 662 is connected to the covering portion 661 and extends toward the stacked unit 45 in the Z-direction. The opposing portion 662 is arranged so as to substantially coincide with the bent portion 634 of the positive bus bar 61P in a plan view in the Z-direction. A plate thickness direction of the opposing portion 662 is approximately parallel to the Y-direction. In the X-direction, a width of the opposing portion 662 is narrower than a width of the covering portion 661. The opposing portion 662 and the bent portion 634 of the positive bus bar 61P are opposed to each other with their plate surfaces spaced apart from each other.

The extended portion 67 is connected (joined) to the opposing portion 662 of the base portion 66. The extended portion 67 is provided separately from the base portion 66 and is integrated with the base portion 66 by connecting them. The extended portion 67 includes a portion that is continuous with the base portion 66 and is extended toward the stacked member 45 in the Z-direction. A plate thickness direction of the extended portion 67 is approximately parallel to the Y-direction. A plate surface of the extended portion 67 is opposed to a plate surface of the distal end portion 353 of the emitter terminal 35E of the lower arm module 30L. The extended portion 67 is connected to the emitter terminal 35E of the lower arm module 30L at a portion where the plate surfaces are opposed to each other. The extended portion 67 is arranged to cover the protruding portion of the main terminal 35, at least a part of the extended portion 64 of the positive bus bar 61P, and at least a part of the output bus bar 62. The extended portion 67 straddles (crosses) the first-stage of the heat exchange member 41 and the second-stage of the heat exchange member 41 in the Z-direction.

As shown in FIGS. 11 and 13, the extended portion 67 has slits 671, parallel extending portions 672, opposing portions 673, and connecting portions 674. The slit 671 is provided between the upper arm module 30H and the lower arm module 30L in a plan view in the Y-direction. The slit 671 is provided between the collector terminal 35C of the upper arm module 30H and the emitter terminal 35E of the lower arm module 30L. The slit 671 may be referred to as a notch. The extended portion 67 has slits 671 for three phases. The three slits 671 are arranged side by side in the X-direction.

The parallel extending portion 672 has a portion adjacent to the slit 671 in the X-direction. The parallel extending portion 672 defines the slit 671. At least a portion of the parallel extending portion 672 extends parallel to the output bus bar 62. The parallel extending portion 672 and the output bus bar 62 are opposed to each other with their plate surfaces separated from each other. The parallel extending portion 672 extends in the Z-direction, and maintains an opposing relationship with the output bus bar 62 in an extended direction. The extended portion 67 has parallel extending portions 672 for three phases. The three parallel extending portions 672 are provided side by side in the X-direction.

The opposing portion 673 has a portion adjacent to the slit on a side to the capacitor module 50 in the Z-direction. The opposing portion 673 defines the slit 671. The opposing portion 673 extends from the parallel extending portion 672 in the X-direction. The opposing portion 673 and the extended portions 64 of the positive bus bar 61P are arranged to oppose each other with their plate surfaces in a spaced apart manner from each other. The opposing portion 673 maintains an opposing relationship with the extended portion 64 over the entire length of the extended portion 64, for example.

The connecting portion 674 is adjacent to the slit 671 on a side opposite to the opposing portion 673 in the Z-direction. The connecting portion 674 defines the slit 671. The connecting portion 674 extends from the parallel extending portion 672 in the X-direction. A plate surface of the connecting portion 674 is opposed to a plate surface of the distal end portion 353 of the emitter terminal 35E of the lower arm module 30L. The extended portion 674 is connected to the emitter terminal 35E of the lower arm module 30L at a portion where the plate surfaces are opposed to each other.

As shown in FIG. 5 etc., the extended portion 68 is continuous with the base portion 66 at an opposite side where the extended portion 67 is connected. The extended portion 68 extends from the base portion 66 in a direction which is opposite to the extended portion 67. A width of the extended portion 68 is narrower than a width of the base portion 66. The extended portion 68 is arranged side by side with the extended portion 65 of the positive bus bar 61P in the X-direction. The extended portion 68 constitutes the connector 80. The extended portion 68 is a negative terminal of the connector 80. The connector 80 is constituted to include the extended portion 65 and 68 and a part of the case 51. The connector 80 may be referred to as an input terminal base.

The output bus bar 62 electrically connects the emitter terminal 35E of the upper arm module 30H and the collector terminal 35C of the lower arm module 30L. The output bus bar 62 has a portion extending in a side away from the capacitor module 50 in the Z-direction. The plate surface of the output bus bar 62 is opposed to the plate surface of the distal end portion 353 of the emitter terminal 35E of the upper arm module 30H and the plate surface of the distal end portion 353 of the collector terminal 35C of the lower arm module 30L. The output bus bar 62 is connected to each of the distal end portions 353 at a portion where the plate surfaces are opposed to each other.

The bus bars 60 include output bus bars 62 for three phases. The plate surfaces of the U-phase output bus bar 62(U) and one of the parallel extending portions 672 are arranged to be opposed to each other. The plate surfaces of the V-phase output bus bar 62(V) and the other one of the parallel extending portions 672 are arranged to be opposed to each other. The plate surfaces of the W-phase output bus bar 62(W) and the other one of the parallel extending portions 672 are arranged to be opposed to each other. Each of the output bus bars 62 straddles, i.e., crosses the second-stage of the heat exchange member 41 and the third-stage of the heat exchange member 41 in the Z-direction. One end of each output bus bar 62 protrudes outwardly from the opening of the case 20 so as to be connectable to the motor generator 3.

A current sensor 81 is disposed on a middle of the output bus bar 62. The current sensor 81 is provided individually for the output bus bar 62. The current sensor 81 detects phase current. The current sensor 81 is placed in an inside of the case 20. As described above, the extended portion 67 of the negative bus bar 61N is provided separately from the base portion 66. Therefore, in a connecting process, i.e., joining process of the bus bars 60, first, as shown in FIG. 12, the bus bars 60 on a side of a lower layer in the Z-direction are connected to the corresponding main terminals 35. Specifically, the extended portion 64 of the positive bus bar 61P is connected to the collector terminal 35C(P) of the upper arm module 30H, and the output bus bar 62 is connected to the emitter terminal 35E(O) of the upper arm module 30H and the collector terminal 35C(O) of the lower arm module 30L.

Next, as shown in FIG. 13, the bus bars 60 on a side of the upper layer in the Z-direction are connected to the corresponding main terminals 35. Specifically, the extended portion 67 of the negative bus bar 61N is connected to the base portion 66 and also to the emitter terminal 35E(N) of the lower arm module 30L. Thereby, it is possible to realize a structure in which the negative bus bar 61N and the positive bus bar 61P run in parallel, and a structure in which the negative bus bar 61N and the output bus bar 62 run in parallel.

<Circuit Board>

The circuit board 70 includes a wiring board in which wirings are arranged on an insulating base member such as resin, and electronic components (not shown) mounted on the wiring board. Wirings and electronic components constitute a circuit. The above-described drive circuit 7 is configured on the circuit board 70.

The circuit board 70 includes a connector 71 for connection with external devices. The connector 71 includes a housing molded using resin or the like, and terminals held by the housing and mounted on a wiring board. For convenience, terminals are simplified or omitted in each drawing. If the control circuit is provided outside the power control apparatus 4, a drive command for the control circuit is inputted via the connector 71. If the control circuit is provided on the circuit board 70, a torque request is input from the host ECU via the connector 71.

The circuit board 70 is arranged on a side of the opening of the case 20 in the Z-direction. The circuit board 70 is arranged so as to locate the capacitor module 50 and the stacked unit 45 between it and the bottom wall 21 of the case 20. The circuit board 70 is arranged so as to overlap the capacitor module 50 and the stacked unit 45 in a plan view in the Y-direction. The signal terminals 36 of the semiconductor modules 30 included in the stacked unit 45 are connected to the circuit board 70 by an insertion mounting. Note that a surface mounting structure may be adopted instead of an insertion mounting. The circuit board 70 has a through hole (not shown) for allowing the output bus bars 62 to protrude outwardly from the case 20.

Summary of First Embodiment

Figure 14:
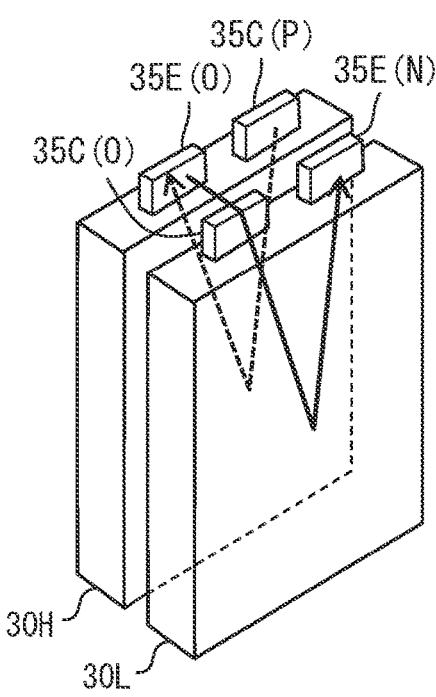
FIG. 14 is a diagram showing a PN current loop.
Figure 14:
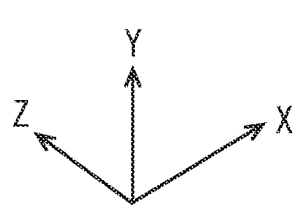

FIG. 14 shows the PN current loop in this embodiment. If an inductance of the main circuit should be evaluated, it should be considered that a PN current loop that is the current path from the collector terminal 35C of the upper arm module 30H, which is the P-terminal, to the emitter terminal 35E of the lower arm module 30L, which is the N-terminal. Among the current paths, a current path from the collector terminal 35C(P) to the emitter terminal 35E(O) of the upper arm module 30H is shown by a dashed line, and a current path from the emitter terminal 35E(O) of the upper arm module 30H to the emitter terminal 35E(N) of the lower arm module 30L is shown by a solid line. Actually, each one of the semiconductor elements 32 is controlled so that the semiconductor element 32 of the upper arm module 30H and the semiconductor element 32 of the lower arm module 30L, which constitute the upper and lower arm circuit 10, are not turned on at the same time.

According to this embodiment, as shown in FIGS. 8, 14 and etc., the plurality of semiconductor modules 30 are grouped into an upper arm module 30H and a lower arm module 30L. The upper arm module 30H and the lower arm module 30L are arranged in parallel in the Z-direction, i.e., in the stacking direction. Thereby, it is possible to make the PN current loop smaller compared to a configuration in which one module provides the upper and lower arm circuit for one phase, or a configuration in which the upper arm module and the lower arm module are arranged side by side in the X-direction. If the PN current loop is smaller, members through which the current flows in opposite directions approach each other, and the effect of canceling out the magnetic flux is enhanced, therefore, it is possible to reduce an inductance.

Figure 15:
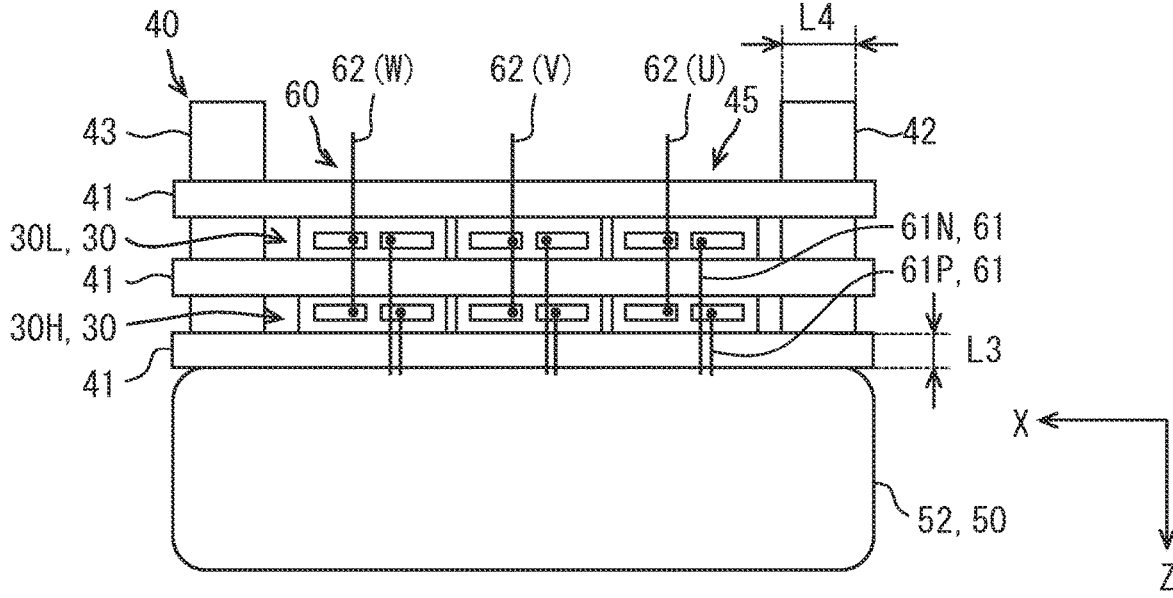
FIG. 15 is a diagram showing shortening of a length of a power bus bar.

FIG. 15 shows the arrangement of the semiconductor modules 30, the cooler 40, and the capacitor module 50 in this embodiment. In this embodiment, as shown in FIG. 15, the capacitor module 50 is arranged in the Z-direction with respect to the stacked member 45. The power bus bars 61 are extended in the Z-direction so as to straddle at least one of the heat exchange members 41 arranged in multiple stages. A length L3 of one stage of the heat exchange member 41 is sufficiently shorter than a length L4, which is equal to the diameter of the pipe. Therefore, it is possible to shorten a length of the power bus bars 61 compared to a configuration in which the capacitor module is arranged next to the stacked unit in the X-direction and the power bus bar is extended in the X-direction to straddle one of the pipes. In other words, it is possible to shorten the current path.

By reducing the above-described PN current loop and shortening the power bus bar length, the power control apparatus 4 of this embodiment can reduce an inductance.

Figure 16:
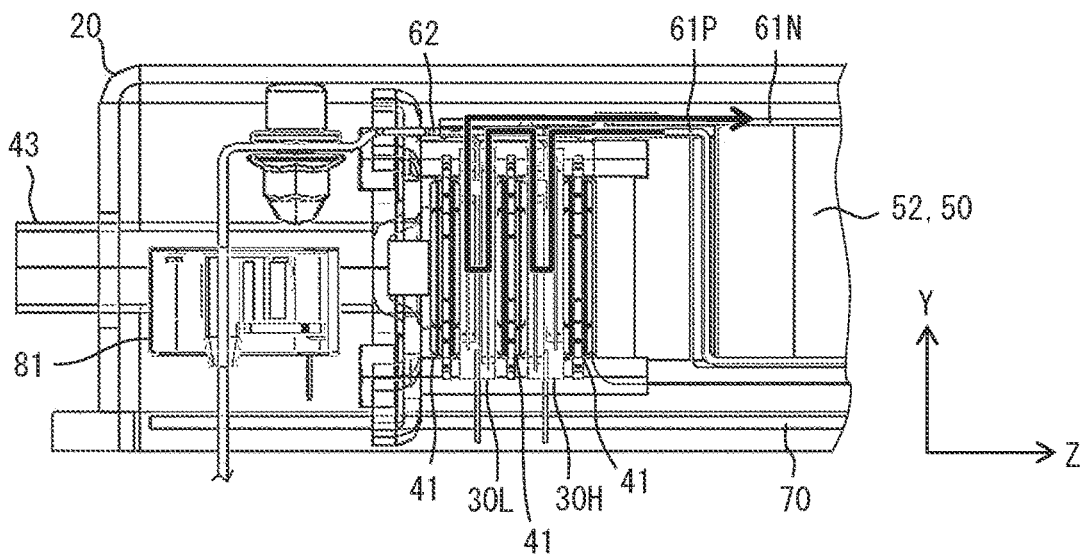
FIG. 16 is a diagram showing a current path.

The arrangement of the positive bus bar 61P and the negative bus bar 61N, which are the power bus bars 61, and the output bus bars 62 is not particularly limited. FIG. 16 shows a current path of the main circuit including smoothing capacitor 5 and inverter 6. As shown in FIGS. 9, 10, 16, etc., in this embodiment, the lower arm module 30L is arranged farther away from the capacitor module 50 than the upper arm module 30H. As shown in FIGS. 10, 11, 16, etc., the negative bus bar 61N and the positive bus bar 61P are placed so that plate surfaces are opposed to each other and extend in the Z-direction. The negative bus bar 61N and the output bus bar 62 are placed so that plate surfaces are opposed to each other and extend in the Z-direction.

By arranging the bus bars 60 so as to be opposed to each other in this way, it is possible further reduce an inductance due to the effect of magnetic flux cancellation. Note that in this embodiment, an example has been shown in which the negative bus bar 61N is opposed to the positive bus bar 61P and the output bus bar 62, but this disclosure is not limited thereto. The negative bus bar 61N may be arranged to be opposed to at least one of the positive bus bar 61P and the output bus bar 62.

In this embodiment, a plurality of upper arm modules 30H that constitute the three-phase upper and lower arm circuit 10 are arranged side by side in the X-direction orthogonal to the Z-direction. The upper arm modules 30H are arranged to overlap in the X-direction. The upper arm modules 30H are arranged in parallel in the X-direction. The upper arm modules 30H are arranged in a stage of the stacking member 45. Similarly, the lower arm modules 30L are arranged side by side in the X-direction. The upper arm modules 30H are arranged to overlap in the X-direction. The upper arm modules 30H are arranged in parallel in the X-direction. The upper arm modules 30H are arranged in a stage of the stacking member 45. Thereby, it is possible to arrange the semiconductor modules 30 in two stages, and the heat exchange members 41 in three stages in the stacked member 45. Therefore, it is possible to reduce the size of the stacked unit 45 in the Z-direction. Further, in all phases, it is possible to reduce an inductance by reducing the PN current loop and shortening length of the power bus bars. Furthermore, it is possible to further reduce an inductance by the opposing arrangement. In other words, it is possible to achieve both downsizing and reduction of an inductance.

The upper arm module 30H and the lower arm module 30L may be arranged so that arrangement orders of a side by side manner of the collector terminals 35C and the emitter terminals 35E are the same. In this embodiment, the lower arm module 30L is arranged so that the front and back surfaces of the semiconductor element 32 are reversed with respect to the upper arm module 30H. As a result, since the arrangement orders of a side by side manner of the collector terminal 35C and the emitter terminal 35E are in a reversed relationship with each other, the emitter terminal 35E of the upper arm module 30H and the collector terminal 35C of the lower arm module 30L are easily connected by the output bus bar 62. In other words, an arrangement of the bus bars 60 can be simplified.

A shape of the protruding portion of the main terminal 35 is not particularly limited. For example, an entire shape of the protruding portion may have a shape extending in the Y-direction. In this embodiment, the protruding portions of the plurality of main terminals 35 have bent portions 351, respectively. The plate surface of the distal end portion 353, which is a portion closer to the distal end of the protruding portion than the bent portion, is opposed to the plate surface of the corresponding bus bar 60. In this way, it is possible to shorten a distance to the bus bars 60 to be connected, and to reduce an inductance by arranging the bent portions 351. In addition, connecting processing such as welding may be easily performed. In particular, in this embodiment, the protruding portion of each main terminal 35 defines the length L1 of the root portion 352 shorter than the length L2 of the distal end portion 353. Thereby, it is possible to effectively reduce an inductance.

The extended portion 67 of the negative bus bar 61N may be continuously connected to the base portion 66. In this embodiment, the extended portion 67 is provided separately from the base portion 66, and are integrated by joining. According to this, as shown in FIGS. 12 and 13, the positive bus bar 61P as a lower layer and the output bus bar 62 can be joined to the corresponding main terminals 35 before the extended portion 67 is joined. In other words, the bus bars 60 and the corresponding main terminals 35 can be easily joined.

Figure 17:
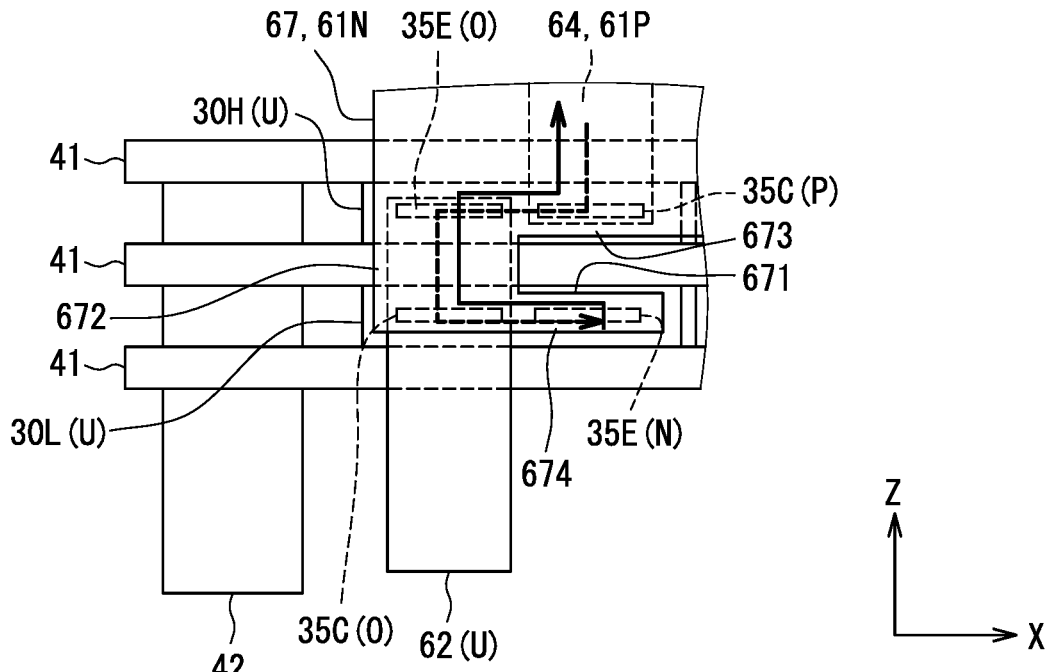
FIG. 17 is a diagram showing a current path.

The extended portion 67 may have a substantially rectangular shape, e.g., in a plan view in the Y-direction so as to integrally cover a portion of each of the main terminals 35, the extended portion 64 of the negative bus bar 61N, and the output bus bar 62. FIG. 17 shows a current path of the main circuit. FIG. 17 corresponds to FIG. 11. FIG. 17 shows a U-phase current path as an example. Among the current paths, the solid arrow indicates the path in the extended portion 67 of the negative bus bar 61N, and the dashed arrow indicates the path from the extended portion 64 of the positive bus bar 61P to the emitter terminal 35E(N) of the lower arm module 30L.

As shown in FIGS. 11, 13, 17, etc., the extended portion 67 of the negative bus bar 61N of this embodiment includes the slits 671, the parallel extending portions 672, the opposing portions 673, and the connecting portions 674. By providing the slits 671 in this manner, the current path in the negative bus bar 61N (extended portion 67) is restricted. Specifically, a current flows along the slit 671. Therefore, as shown in FIG. 17, it is possible to increase parallel extending distances in the current path. With this configuration, it is possible to improve the effect of canceling out a magnetic flux, and it is possible to reduce an inductance. Further, since the slit 671 is located adjacent to each other, the connecting portion 674 may be easily bent relative to other portions of the extended portion 67 in order to be connected to the emitter terminal 35E(N). In other words, the emitter terminal 35E of the lower arm module 30L and the extended portion 67 can be easily joined.

Modifications

Although, the upper arm module 30H arranged on a side to the capacitor module 50 in the Z-direction, i.e., in the stacking direction, is described as an example, the disclosure is not limited thereto. The lower arm module 30L may be placed on a side to the capacitor module 50. In this case, the upper arm module 30H corresponds to the first semiconductor module, and the lower arm module 30L, which is closer to the capacitor module 50 than the upper arm module 30H, corresponds to the second semiconductor module. Furthermore, the positive bus bar 61P corresponds to a first power bus bar, and the negative bus bar 61N corresponds to a second power bus bar.

If the positive bus bar 61P is used as the first power supply bus bar, the extended portion of the positive bus bar 61P may be arranged to cover the protruding portion of the main terminals 35, at least a part of the extended portion of the negative bus bar 61N, and at least a part of the extended portion of the output bus bar 62. The extended portion of the positive bus bar 61P may be provided separately from the base portion. A slit or the like may be provided in the extended portion of the positive bus bar 61P to increase parallel extending distances.

Although, a plurality sets of the upper arm modules 30H and the lower arm modules 30L is described as an example, the disclosure is not limited thereto. For example, an upper arm 10H for three phases may be provided by a single upper arm module 30H which is formed by integrally encapsulating and sealing the semiconductor modules 30 for three phases with the sealing member 31 commonly used. Similarly, the lower arm 10L for three phases may be provided by one lower arm module 30L.

Second Embodiment

This embodiment is a modification based on the preceding embodiment, and the description of the preceding embodiment are incorporated. In the preceding embodiment, one semiconductor element 32 constitutes one arm 10H and 10L. Alternatively, a plurality of semiconductor elements 32 may be connected in parallel to each other to form one arm 10H and 10L.

Figure 18:
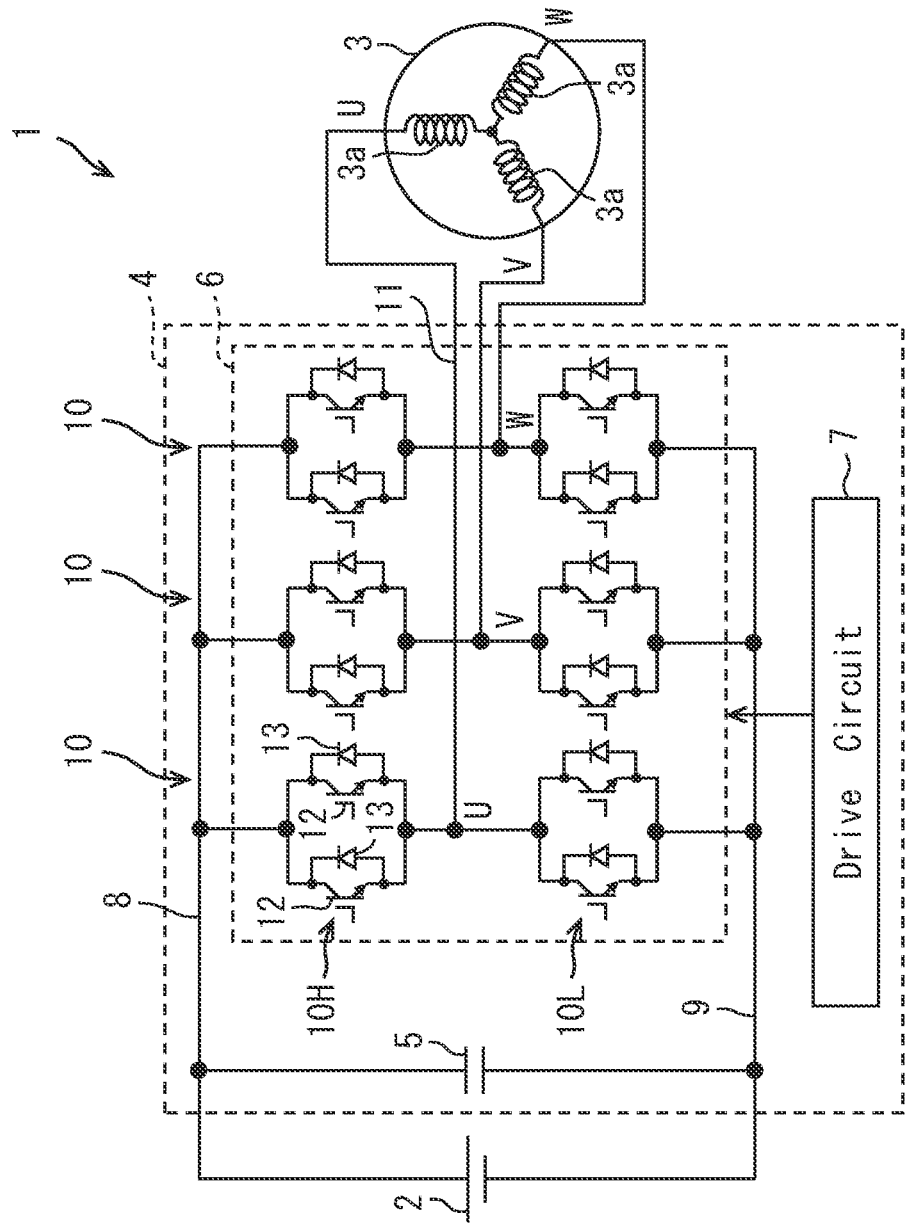
FIG. 18 is a diagram showing a circuit configuration of a power control apparatus according to a second embodiment.
Figure 19:
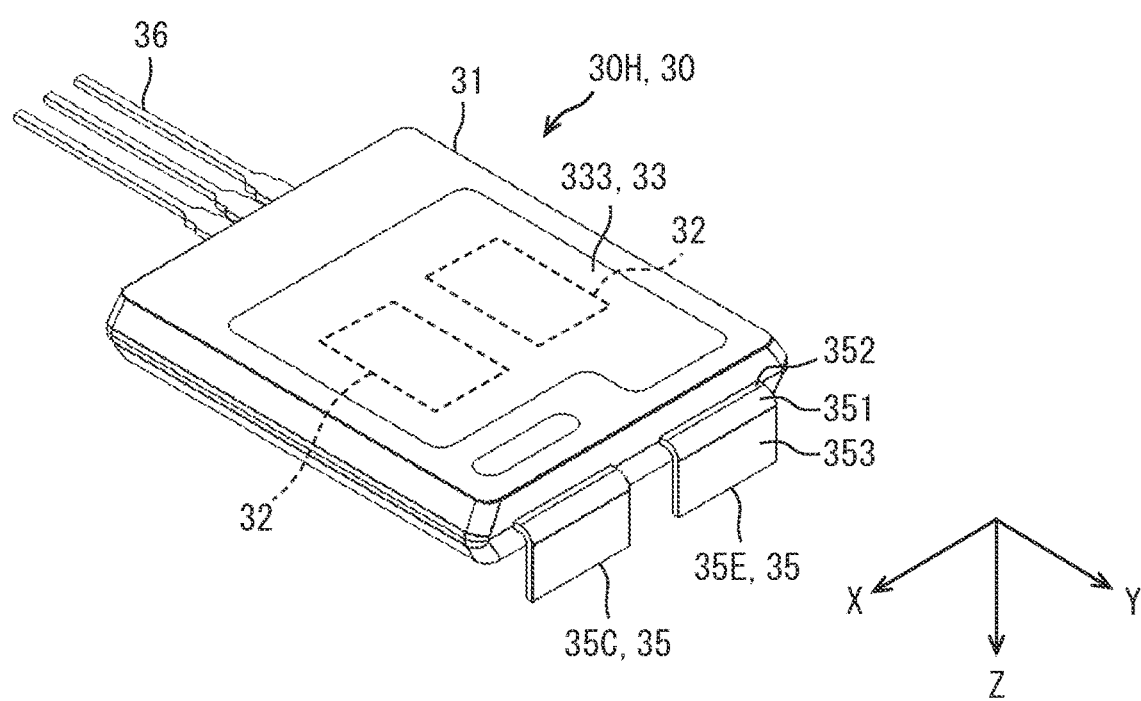
FIG. 19 is a perspective view showing a semiconductor module.

FIG. 18 is a diagram showing a circuit configuration of a power control apparatus 4 according to this embodiment. FIG. 19 is a perspective view showing a semiconductor module 30. FIG. 19 corresponds to FIG. 6 and shows the upper arm module 30H as an example.

As shown in FIG. 18, in the power control apparatus 4 of this embodiment, each arm 10H and 10L of the upper and lower arm circuits 10 that constitute the inverter 6 is configured by two IGBTs 12 connected in parallel. The two parallelly connected IGBT 12 are controlled by the gate drive signal of which high level and low level are switched at the same timing. The FWD 13 is connected in a parallel and reversed manner to each of the IGBTs 12.

As shown in FIG. 19, the semiconductor module 30 includes two semiconductor elements 32. RC-IGBTs are formed in each semiconductor element 32, as in the preceding embodiment. The two semiconductor elements 32 are arranged side by side in the X-direction. The collector electrodes 32C of the two semiconductor elements 32 are electrically connected to a common collector terminal 35C via the front metal member 332, i.e., the wiring portion 334. The emitter electrodes 32E of the two semiconductor elements 32 are electrically connected to a common emitter terminal 35E via the front metal member 342, i.e., the wiring portion 344.

Summary of Second Embodiment

The power control apparatus 4 of this embodiment has the same configuration as the power control apparatus 4 shown in the preceding embodiment except that the semiconductor module 30 includes a plurality of semiconductor elements 32. The stacked unit 45 is constituted by the heat exchange members arranged in three stages and the semiconductor modules 30 arranged in two stages. The upper arm module 30H and the lower arm module 30L are arranged in parallel in the Z-direction. The upper arm module 30H and the lower arm module 30L are arranged to overlap in the Z-direction at least a part of a plate surface of the semiconductor module 30. As a result, the upper arm module 30H and the lower arm module 30L are arranged in parallel in the stacking direction, i.e., the Z-direction. Any of the configurations shown in the preceding embodiment and its modified examples may be applied to the power control apparatus 4 of this embodiment. Therefore, the power control apparatus 4 of this embodiment can have the same effect as the power control apparatus 4 of the preceding embodiment.

Modifications

The number of switching elements constituting one arm 10H or 10L is not limited to two. There may be three or more. The number of semiconductor elements 32 included in the semiconductor module 30 is also not limited to two. There may be three or more.

Third Embodiment

This embodiment is a modification based on the preceding embodiment, and the description of the preceding embodiment are incorporated. In the second embodiment, one semiconductor module 30 provides a parallel circuit for one arm 10H and 10L. Alternatively, a parallel circuit may be provided by a plurality of semiconductor modules 30.

Figure 20:
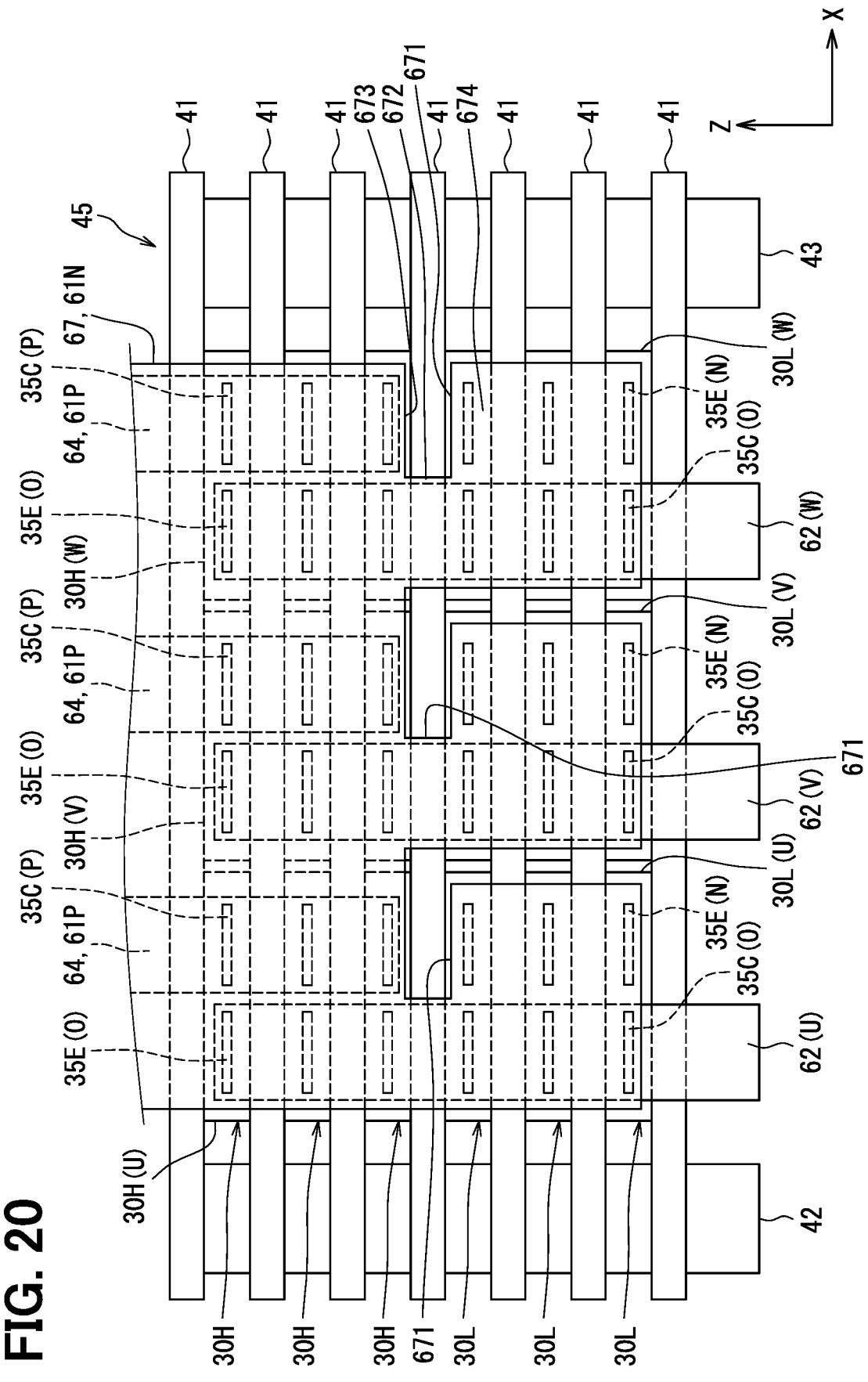
FIG. 20 is a plan view showing an arrangement of a stacked unit and bus bars in a power control apparatus according to a third embodiment.
Figure 21:
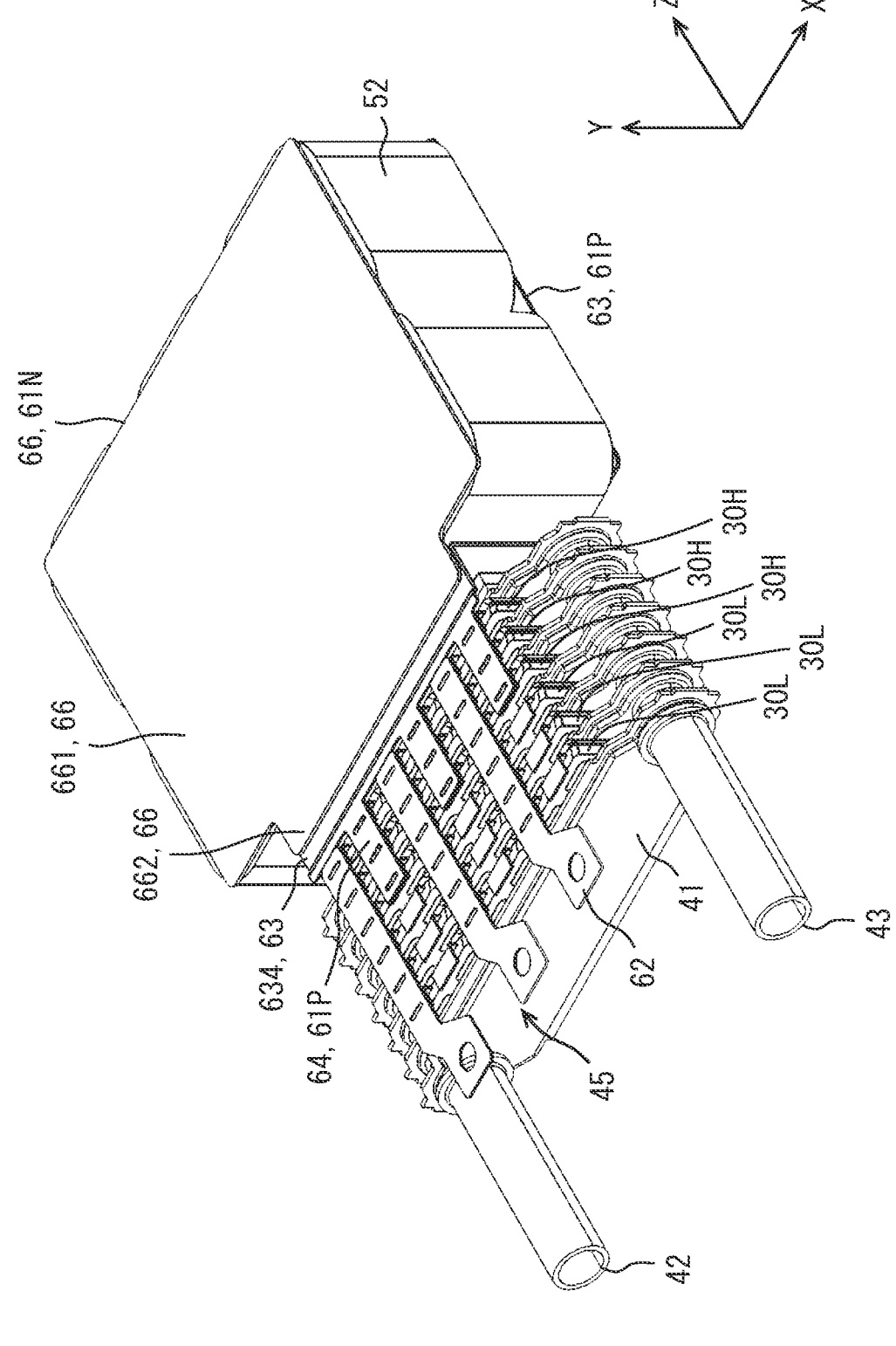
FIG. 21 is a perspective view showing a state before connecting extended portions of a negative bus bar.
Figure 22:
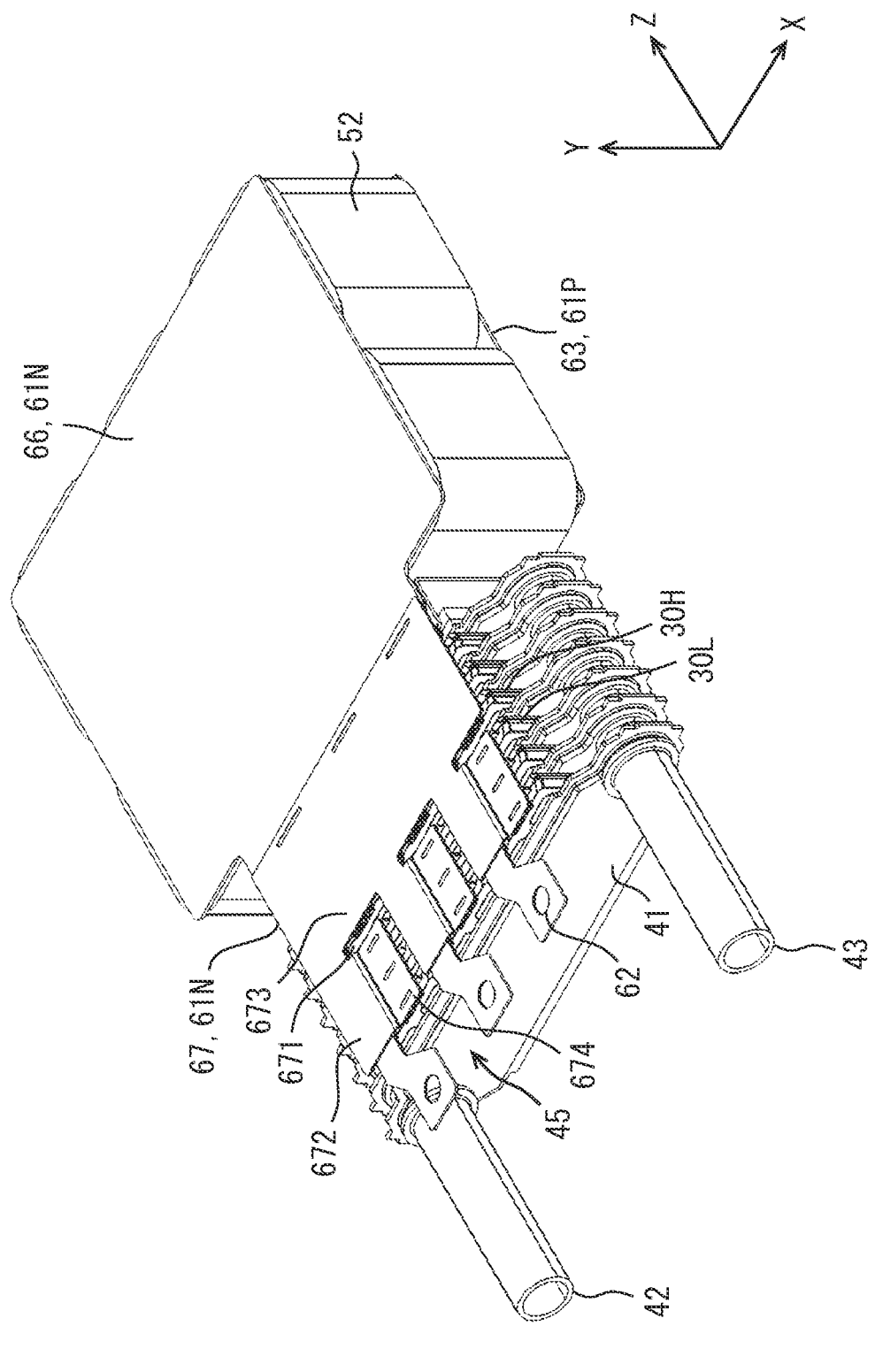
FIG. 22 is a perspective view showing a state after connecting extended portions of a negative bus bar.

FIG. 20 shows an arrangement of the stacked unit 45 and the bus bars 60 in the power control apparatus 4 according to this embodiment. FIG. 20 corresponds to FIG. 11. FIG. 21 shows a state before arranging the extended portion 67 of the negative bus bar 61N, and FIG. 22 shows a state after arranging the extended portion 67. FIGS. 21 and 22 correspond to FIGS. 12 and 13. In FIGS. 21 and 22, for convenience, the extended portion 65 of the positive bus bar 61P and the extended portion 68 of the negative bus bar 61N are omitted.

In this embodiment, each semiconductor module 30 has the same configuration as in the first embodiment. See FIGS. 6 and 7. In other words, one semiconductor module 30 includes one semiconductor element 32. Although not shown, each arm 10H and 10L of the upper and lower arm circuit 10 is configured by three IGBTs 12 connected in parallel.

As shown in FIGS. 20 to 22, the stacked unit 45 includes the semiconductor modules 30 arranged to include six stages and heat exchange member 41 arranged to include seven stages. The three semiconductor modules 30 on the side closer to the capacitor module 50 in the Z-direction are the upper arm modules 30H, and the three semiconductor modules 30 on the far side are the lower arm modules 30L. The upper arm modules 30H are arranged of a side by side manner in the X-direction in the order of U phase, V phase, and W phase in each stage. The extended portions 64 of the positive bus bar 61P extend in the Z-direction and are electrically connected to the three collector terminals 35C(P) of the corresponding phase.

The lower arm modules 30L are also arranged side by side in the X-direction in the order of U phase, V phase, and W phase in each stage. The output bus bar 62 extends in the Z-direction and is electrically connected to the main terminal 35 of the corresponding phase, specifically, to the emitter terminal 35E(O) of the upper arm module 30H and the collector terminal 35C(O) of the lower arm module 30L.

The extended portion 67 of the negative bus bar 61N has the slits 671, the parallel extending portions 672, the opposing portions 673, and the connecting portions 674, as in the preceding embodiment. The slit 671 is provided between the upper arm module 30H and the lower arm module 30L in each phase. The slit 671 is provided between the collector terminals 35C(P) and the emitter terminals 35E(N). The parallel extending portion 672 is provided so as to overlap the connecting portion of the main terminal 35 of the output bus bar 62 in a plan view in the Z-direction so that the plate surface is opposed to a plate surface of the output bus bar 62. The opposing portion 673 extends from the parallel extending portion 672 in the X-direction and is provided to overlap with the extended portion 64 of the positive bus bar 61P. The connecting portion 674 extends from the parallel extending portion 672 in the X-direction and is electrically connected to the emitter terminal 35E(N) of the lower arm module 30L.

In this manner, in this embodiment, three upper arm modules 30H of the same phase are connected in parallel by the bus bars 61P and 62. Three lower arm modules 30L of the same phase are connected in parallel by the bus bars 61N and 62.

As shown in FIGS. 21 and 22, the extended portion 67 of this embodiment is also provided separately from the base portion 66. Therefore, in a connecting process, i.e., joining process of the bus bars 60, first, as shown in FIG. 21, the bus bars 60 on a side of a lower layer in the Z-direction are connected to the corresponding main terminals 35. Specifically, the extended portion 64 of the positive bus bar 61P is connected to the collector terminal 35C(P) of the upper arm module 30H, and the output bus bar 62 is connected to the emitter terminal 35E(O) of the upper arm module 30H and the collector terminal 35C(O) of the lower arm module 30L.

Next, as shown in FIG. 22, the bus bars 60 on a side of the upper layer in the Z-direction are connected to the corresponding main terminals 35. Specifically, the extended portion 67 of the negative bus bar 61N is connected to the base portion 66 and also to the emitter terminal 35E(N) of the lower arm module 30L. Thereby, it is possible to realize a structure in which the negative bus bar 61N and the positive bus bar 61P extend in parallel, and a structure in which the negative bus bar 61N and the output bus bar 62 extend in parallel.

Summary of Third Embodiment

The power control apparatus 4 of this embodiment has the same configuration as the power control apparatus 4 shown in the first embodiment except that a plurality of semiconductor modules 30 are connected in parallel by bus bars 60. For example, in this embodiment as well, the plurality of semiconductor modules 30 are grouped into an upper arm module 30H and a lower arm module 30L, and the upper arm module 30H and the lower arm module 30L are arranged in parallel in the Z-direction. According to this, it is possible to shorten the PN current loop. Further, the capacitor module 50 is arranged in the Z-direction with respect to the stacked unit 45. The power bus bars 61 are extended in the Z-direction so as to straddle at least one of the heat exchange members 41 arranged in multiple stages. Thereby, it is possible to shorten a length of the power bus bars 61. Therefore, it is possible to reduce an inductance.

The configuration described in the present embodiment may be combined with any of the configurations described in the first embodiment and the modifications thereof.

Modifications

The number of switching elements constituting one arm 10H or 10L is not limited to three. There may be two or four or more. The number of the semiconductor modules 30 is not limited to three. It may be two or four.

OTHER EMBODIMENTS

The disclosure in this specification, the drawings, and the like is not limited to the exemplified embodiments. The present disclosure includes embodiments described above and modifications of the above-described embodiments made by a person skilled in the art. For example, the disclosure is not limited to the combinations of components and/or elements shown in the embodiments. The disclosure may be implemented in various combinations. The disclosure may include additional portions that can be added to the embodiments. The disclosure includes those in which the components and/or elements of the embodiments are omitted. The disclosure includes the reallocation or combination of components and/or elements between one embodiment and another embodiment. The disclosed technical scope is not limited to the description of the embodiments. The several technical scopes disclosed are indicated by the description of the claims, and should be further understood to include meanings equivalent to the description of the claims and all modifications within the scope.

The disclosure in the specification, drawings and the like is not limited by the description of the claims. The disclosures in the specification, the drawings, and the like encompass the technical ideas described in the claims, and further extend to a wider variety of technical ideas than those in the claims. Hence, various technical ideas can be extracted from the disclosure of the specification, the drawings, and the like without being bound by the description of the claims.

When an element or layer is referred to as being "on," "coupled," "connected," or "combined," it may be directly on, coupled, connected, or combined to the other element or layer, or further, intervening elements or layers may be present. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatially relative terms such as "inner," "outer," "back," "below," "low," "above," and "high" are utilized herein to facilitate description of one element or feature's relationship to another element (s) or feature (s) as illustrated. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in the other direction (rotated 90 degrees or in any other direction) and the spatially relative terms used herein are interpreted accordingly.

The vehicle drive system 1 is not limited to the above structure described in the embodiments. Although the present disclosure describes that one motor generator 3 is provided, it is not limited to the example described in the present disclosure. A plurality of motor generators may be provided.

Although, the power control apparatus 4 including the inverter 6 as the power conversion circuit is described as an example, the disclosure is not limited thereto. For example, a plurality of inverters may be provided. At least one inverter and a converter may be provided. Only the converter may be provided.

What is claimed is:

1. A power control apparatus, comprising:
a plurality of semiconductor modules each including an upper arm module forming an upper arm of an upper and lower arm circuit and a lower arm module forming a lower arm of the upper and lower arm circuit, the lower arm module being arranged in parallel in a stacking direction toward the upper arm module;
a cooler having a plurality of heat exchange members arranged at outer ends and alternately with the semiconductor modules in the stacking direction to form a stacked unit, wherein the heat exchange members cool the upper arm modules and the lower arm modules from both sides in the stacking direction;
a capacitor disposed on one end side of the stacked unit in the stacking direction; and
a plurality of bus bars electrically connecting the capacitor to each of the semiconductor modules and including a power bus bar extending in the stacking direction and extending over at least one of the heat exchange members, wherein
the power bus bar includes a positive bus bar that electrically connects a positive electrode of the capacitor and each of the upper arm modules, and a negative bus bar that electrically connects a negative electrode of the capacitor and each of the lower arm modules, and
the plurality of bus bars further includes an output bus bar that electrically connects to each of the upper arm modules and each of the lower arm modules and extends in from a side of the stacked unit that is opposite the capacitor in the stacking direction.

2. The power control apparatus according to claim 1, wherein
one of the upper arm module and the lower arm module in each of the semiconductor modules is further away from the capacitor in the stacking direction than the other, and
each of the positive bus bar, the negative bus bar, and the output bus bar includes a plate surface and wherein the negative bus bar, the positive bus bar and the output bus bar are arranged such that the plate surface of the negative bus bar and the face plate of at least one of the positive bus bar and the output bus bar are opposed to each other and extend in the stacking direction.

3. The power control apparatus according to claim 2, wherein
the semiconductor modules respectively include a semiconductor element, a sealing member that encapsulates and seals the semiconductor element, and a plurality of main terminals electrically connected to the semiconductor element and protrude outwardly from the sealing member to be connected to the bus bars, and wherein the main terminals in each semiconductor module include a first main terminal connected to a front surface of the semiconductor element in the stacking direction and a second main terminal connected to a back surface of the semiconductor element, and a protruding portion of the first main terminal and a protruding portion of the second main terminal on each of the semiconductor modules are arranged along one direction perpendicular to the stacking direction.

4. The power control apparatus according to claim 3, wherein the upper arm module and the lower arm module from each of the semiconductor modules together constitute the upper and lower arm circuit of the power conversion apparatus for multi-phase voltage operation, and wherein the upper arm modules of the semiconductor modules are arranged side by side in the one direction perpendicular to the stacking direction and where lower arm modules of the semiconductor modules are arranged side by side in the one direction perpendicular to the stacking direction.

5. The power control apparatus according to claim 3, wherein the lower arm module in each of the semiconductor modules is arranged so that the front and back surfaces of the semiconductor element are opposite with respect to the upper arm module, and an arrangement order of the first main terminal and the second main terminal is in a reversed relationship with that of the upper arm module.

6. The power control apparatus according to claim 3, wherein each one of the main terminals in each of the semiconductor modules has a bent portion on a protruding portion and a distal end opposite the bent portion, and wherein a plate surface on one side of the protruding portion extending to the distal end of each of the main terminals is opposed to another plate surface of a corresponding one of the bus bars.

7. The power control apparatus according to claim 6, wherein the protruding portion of each main terminal defines a length from an end on a side of the sealing member to the bent portion that is shorter than a length from the bent portion to the distal end of the protruding portion.

8. The power control apparatus according to claim 3, wherein the negative power bus bar has a base portion connected to the capacitor, and an extended portion connected to the base portion and including a portion extending in the stacking direction, and wherein the extended portion of the negative power bus bar is arranged so as to cover the protruding portion of each of the main terminals of the semiconductor modules, at least a part of an extended portion of the positive power bus bar extending in the stacking direction, and at least a part of an extended portion of the output bus bar extending in the stacking direction.

9. The power control apparatus according to claim 8, wherein the extended portion of the negative power bus bar includes:

a slit provided between the upper arm module and the lower arm module in each of the semiconductor modules in the stacking direction;

a parallel extending portion adjacent to each slit in the one direction and extending parallel to the extended portion of the output bus bar in the stacking direction;

an opposing portion adjacent to each slit on a side closer to the capacitor in the stacking direction, extending in the one direction from the parallel extending portion and opposing the second power bus bar; and a connecting portion adjacent to each slit on a side opposite to the opposing portion in the stacking direction, extending from the parallel extending portion in the one direction and connected to a corresponding one of the main terminals.

* * * * *